(12) United States Patent
Ogawa

(10) Patent No.: US 10,636,138 B2
(45) Date of Patent: Apr. 28, 2020

(54) POLARIZED IMAGE ACQUISITION APPARATUS, PATTERN INSPECTION APPARATUS, POLARIZED IMAGE ACQUISITION METHOD, AND PATTERN INSPECTION METHOD

(71) Applicant: NuFlare Technology, Inc., Yokohama-shi (JP)

(72) Inventor: Riki Ogawa, Kawasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 110 days.

(21) Appl. No.: 15/714,468

(22) Filed: Sep. 25, 2017

(65) Prior Publication Data

US 2018/0114306 A1 Apr. 26, 2018

(30) Foreign Application Priority Data

Oct. 26, 2016 (JP) .................................. 2016-209664

(51) Int. Cl.
*G06T 7/00* (2017.01)
*G02B 27/10* (2006.01)
(Continued)

(52) U.S. Cl.
CPC ........... *G06T 7/001* (2013.01); *G01N 21/956* (2013.01); *G01N 21/95607* (2013.01);
(Continued)

(58) Field of Classification Search
CPC .......... G06T 7/001; G06T 2207/10148; G06T 2207/30148; G06T 5/50; G01N 21/956;
(Continued)

(56) References Cited

U.S. PATENT DOCUMENTS 5,430,548 A * 7/1995 Hiroi ................. G01N 21/95607
250/548
6,268,093 B1 7/2001 Kenan et al.
(Continued)

FOREIGN PATENT DOCUMENTS

JP 10-133202 A 5/1998
JP 2001-235853 8/2001
(Continued)

OTHER PUBLICATIONS

Combined Taiwanese Office Action and Search Report dated Jun. 21, 2018 in Taiwanese Patent Application No. 106133621 (with English translation), 9 pages.

*Primary Examiner* — Maria E Vazquez Colon
(74) *Attorney, Agent, or Firm* — Oblon, McClelland, Maier & Neustadt, L.L.P.

(57) ABSTRACT

A polarized image acquisition apparatus includes a division type half-wave plate, located opposite to the mask substrate with respect to an objective lens and near an objective lens pupil position, to arrange P and S polarized waves of the transmitted light having passed through the objective lens to be mutually orthogonal, a Rochon prism to separate trajectories of P and S polarized waves, an imaging lens to form images of P and S polarized waves having passed through the Rochon prism at image formation positions different from each other, a mirror, in a case where one of P and S polarized waves is focused/formed at one of the different image formation positions, to reflect the other wave at the other position, a first sensor to capture an image of one of P and S polarized waves, and a second sensor to capture an image of the other wave.

5 Claims, 9 Drawing Sheets

(51) Int. Cl.
*G02B 15/15* (2006.01)
*G02B 27/09* (2006.01)
*H04N 5/225* (2006.01)
*G06T 5/50* (2006.01)
*G01N 21/956* (2006.01)
*G02B 5/30* (2006.01)
*G02B 21/00* (2006.01)
*G03F 1/84* (2012.01)
*G03F 7/20* (2006.01)
*G01N 21/88* (2006.01)
*G02B 27/28* (2006.01)

(52) U.S. Cl.
CPC ........... *G02B 5/3025* (2013.01); *G02B 15/15* (2013.01); *G02B 21/0092* (2013.01); *G02B 27/0938* (2013.01); *G02B 27/10* (2013.01); *G03F 1/84* (2013.01); *G06T 5/50* (2013.01); *H04N 5/2254* (2013.01); *H04N 5/2258* (2013.01); *G01N 2021/8848* (2013.01); *G01N 2021/8896* (2013.01); *G01N 2021/95676* (2013.01); *G01N 2201/0683* (2013.01); *G02B 5/3083* (2013.01); *G02B 27/283* (2013.01); *G03F 7/70491* (2013.01); *G06T 2207/10148* (2013.01); *G06T 2207/30148* (2013.01)

(58) Field of Classification Search
CPC ..... G01N 21/95607; G01N 2021/8848; G01N 2021/8896; G01N 2021/95676; G01N 2021/0683; G02B 5/3025; G02B 15/15; G02B 21/0092; G02B 27/0938; G02B 27/10; G02B 5/3083; G02B 27/283; G03F 1/84; G03F 7/70491; H04N 5/2254; H04N 5/2258
See application file for complete search history.

(56) References Cited

U.S. PATENT DOCUMENTS

| | | |
|---|---|---|
| 2004/0252296 A1 | 12/2004 | Tojo et al. |
| 2005/0122515 A1 | 6/2005 | Borden et al. |
| 2005/0122525 A1 | 6/2005 | Borden et al. |
| 2015/0022812 A1* | 1/2015 | Ogawa ................ G01N 21/956 356/364 |

FOREIGN PATENT DOCUMENTS

| | | |
|---|---|---|
| JP | 2004-301751 A | 10/2004 |
| JP | 2011-169743 A | 9/2011 |
| JP | 2017-90147 | 5/2017 |
| TW | 200525271 A | 8/2005 |

* cited by examiner

|  | Exposure Apparatus | Inspection Apparatus |
|---|---|---|
| NAi | Large | Small |
| S Wave (Intensity) | Same | Same |
| P Wave (Intensity) | Small | Same |

S Polarization → 190 → X Polarization

P Polarization → 190 → Y Polarization

POLARIZED IMAGE ACQUISITION APPARATUS, PATTERN INSPECTION APPARATUS, POLARIZED IMAGE ACQUISITION METHOD, AND PATTERN INSPECTION METHOD

CROSS-REFERENCE TO RELATED APPLICATION

This application is based upon and claims the benefit of priority from the prior Japanese Patent Application No. 2016-209664 filed on Oct. 26, 2016 in Japan, the entire contents of which are incorporated herein by reference.

BACKGROUND OF THE INVENTION

Field of the Invention

Embodiments of the present invention relate to a polarized image acquisition apparatus, pattern inspection apparatus, polarized image acquisition method, and pattern inspection method. For example, they relate to an apparatus and method which acquires a polarized image to be used for generating an exposure image of an exposure mask substrate used in semiconductor manufacturing, and to an apparatus and method which inspects a pattern defect of the exposure mask substrate.

Description of Related Art

In recent years, with the advance of high integration and large capacity of large-scale integration (LSI) circuits, the line width (critical dimension) required for circuits of semiconductor elements is becoming progressively narrower. Such semiconductor elements are manufactured by circuit formation of exposing and transferring a pattern onto a wafer by means of a reduced projection exposure apparatus known as a stepper while using an original or "master" pattern (also called a mask or a reticle, hereinafter generically referred to as a mask) with a circuit pattern formed thereon. Then, in fabricating a mask for transfer printing such a fine circuit pattern onto a wafer, a pattern writing apparatus capable of writing or "drawing" fine circuit patterns by using electron beams needs to be employed. Pattern circuits may be written directly on the wafer by the pattern writing apparatus. Also, a laser beam writing apparatus that uses laser beams in place of electron beams for writing a pattern is under development.

Since LSI manufacturing requires a tremendous amount of manufacturing cost, it is crucial to improve its yield. However, as typified by a 1-gigabit DRAM (Dynamic Random Access Memory), the scale of patterns configuring an LSI has become on the order of nanometers from submicrons. One of major factors that decrease the yield of the LSI manufacturing is due to pattern defects on the mask used for exposing and transfer printing an ultrafine pattern onto a semiconductor wafer by the photolithography technology. In recent years, with miniaturization of dimensions of LSI patterns formed on a semiconductor wafer, dimension to be detected as a pattern defect has become extremely small. Therefore, the pattern inspection apparatus for inspecting defects on a transfer mask used in manufacturing LSI needs to be more highly accurate.

As an inspection method, there is known a method of comparing an optical image obtained by imaging a pattern formed on a target object or "sample" such as a lithography mask at a predetermined magnification, by using a magnification optical system, with design data or an optical image obtained by imaging the same pattern on the target object. For example, the methods described below are known as pattern inspection methods: the "die-to-die inspection" method that compares data of optical images of identical patterns at different positions on the same mask; and the "die-to-database inspection" method that inputs, into an inspection apparatus, writing data (design pattern data) generated by converting pattern-designed CAD data to a writing apparatus specific format to be input to the writing apparatus when a pattern is written on the mask, generates a design image (reference image) based on the input writing data, and compares the generated design image with an optical image (serving as measured target data) obtained by imaging the pattern. In such inspection methods for use in the inspection apparatus, a target object is placed on the stage so that a light flux may scan the target object as the stage moves in order to perform an inspection. Specifically, the target object is irradiated with a light flux from the light source through the illumination optical system. The light transmitted through the target object or reflected therefrom forms an image on a sensor through the optical system. The image captured by the sensor is transmitted as measured target data to the comparison circuit. After performing positioning between images, the comparison circuit compares the measured target data with reference data in accordance with an appropriate algorithm, and determines that there exists a pattern defect if the compared data are not identical.

Since the product cycle of semiconductor products is generally short, reducing the time required to manufacture them is an important point. If a mask pattern having a defect is exposed and transferred to a wafer, semiconductor devices made using the wafer become defective. Therefore, it is essential to inspect mask patterns for defects. Defects found in the inspection are corrected by a defect correction apparatus. However, if all the found defects are corrected, it results in increasing the required manufacturing time, thereby decreasing the product value. With the development of the inspection apparatus, it is determined that there is a pattern defect even if a very small deviation occurs. However, when actually transfer-printing a mask pattern onto a wafer by an exposure apparatus, as long as no circuit disconnection and/or no short circuit occurs on the wafer due to such a pattern defect, the circuit can be used as an integrated circuit. Therefore, it is desired to acquire an exposure image exposed on the wafer by the exposure apparatus. However, in the exposure apparatus, mask patterns are reduced to be focused (formed) on the wafer, but, in the inspection apparatus, mask patterns are magnified to be focused (formed) on the sensor. Thus, their configurations of the optical system on the secondary side to the mask substrate are different from each other in the first place. Therefore, even if the state of an illumination light is made to suit the exposure apparatus, as long as the configuration remains unchanged, it is difficult for the inspection apparatus to reproduce a pattern image which is to be transfer printed (exposed and transferred) by the exposure apparatus.

Regarding the above, there is disclosed a dedicated device which inspects, using an aerial image, an exposure image to be exposed and transferred by the exposure apparatus (e.g., refer to Japanese Patent Application Laid-open (JP-A) No. 2001-235853).

BRIEF SUMMARY OF THE INVENTION

According to one aspect of the present invention, a polarized image acquisition apparatus includes a stage configured to mount thereon a mask substrate for exposure on which a pattern is formed, and to be movable; an objective lens configured to receive a transmitted light having passed through the mask substrate; a division type half-wave plate arranged opposite to the mask substrate with respect to the objective lens, and close to a pupil position of the objective lens, and configured to arrange a P-polarized wave and an S-polarized wave of the transmitted light having passed through the objective lens to be in mutually orthogonal directions; a Rochon prism configured to separate a trajectory of the P-polarized wave from a trajectory of the S-polarized wave; an imaging lens configured to focus to form images of the P-polarized wave and the S-polarized wave having passed through the Rochon prism at image formation positions different from each other; a mirror configured, in a case where one of the P-polarized wave and the S-polarized wave is focused and formed at one of the different image formation positions, to reflect an other one of the P-polarized wave and the S-polarized wave at an other one of the different image formation positions; a first image sensor configured to capture an image of the one of the P-polarized wave and the S-polarized wave; and a second image sensor configured to capture an image of the other one of the P-polarized wave and the S-polarized wave.

According to another aspect of the present invention, a pattern inspection apparatus includes a stage configured to mount thereon a mask substrate for exposure on which a pattern is formed, and to be movable; an objective lens configured to receive a transmitted light having passed through the mask substrate; a division type half-wave plate arranged opposite to the mask substrate with respect to the objective lens, and close to a pupil position of the objective lens, and configured to arrange a P-polarized wave and an S-polarized wave of the transmitted light having passed through the objective lens to be in mutually orthogonal directions; a Rochon prism configured to separate a trajectory of the P-polarized wave from a trajectory of the S-polarized wave; an imaging lens configured to focus to form images of the P-polarized wave and the S-polarized wave having passed through the Rochon prism at image formation positions different from each other; a mirror configured, in a case where one of the P-polarized wave and the S-polarized wave is focused and formed at one of the different image formation positions, to reflect an other one of the P-polarized wave and the S-polarized wave at an other one of the different image formation positions; a first image sensor configured to capture an image of the one of the P-polarized wave and the S-polarized wave; a second image sensor configured to capture an image of the other one of the P-polarized wave and the S-polarized wave; a beam splitter configured to branch an illumination light to go to the objective lens, and make a reflected light from the mask substrate pass through the beam splitter via the objective lens; a first transmission mechanism configured to move the division type half-wave plate and the Rochon prism between an inside and an outside of an optical path; and a second transmission mechanism configured to move the beam splitter between the inside and the outside of the optical path, wherein, the division type half-wave plate and the Rochon prism, instead of the beam splitter, are arranged in the optical path in a case where a polarized image is acquired, and the beam splitter, instead of the division type half-wave plate and the Rochon prism, is arranged in the optical path in a case where a pattern inspection is performed, the imaging lens, in the case where the pattern inspection is performed, focuses and forms an image of one of the transmitted light and the reflected light at the one of the different image formation positions which is corresponding to the one of the P-polarized wave and the S-polarized wave, and focuses and forms an image of another one of the transmitted light and the reflected light at the other one of the different image formation positions, the mirror, in the case where the pattern inspection is performed, reflects the other one of the transmitted light and the reflected light at the other one of the different image formation positions, the first image sensor, in the case where the pattern inspection is performed, captures an image of the one of the transmitted light and the reflected light, and the second image sensor, in the case where the pattern inspection is performed, captures an image of the other one of the transmitted light and the reflected light.

According to yet another aspect of the present invention, a polarized image acquisition method includes illuminating a mask substrate for exposure, on which a pattern is formed, with an illumination light; receiving a transmitted light, being the illumination light having passed through the mask substrate, by an objective lens; arranging a P-polarized wave and an S-polarized wave of the transmitted light having passed through the objective lens to be in mutually orthogonal directions, by using a division type half-wave plate arranged opposite to the mask substrate with respect to the objective lens, and close to a pupil position of the objective lens; separating a trajectory of the P-polarized wave from a trajectory of the S-polarized wave by using a Rochon prism; focusing and forming images of the P-polarized wave and the S-polarized wave having passed through the Rochon prism at image formation positions different from each other by using an imaging lens; reflecting, in a case where one of the P-polarized wave and the S-polarized wave is focused and formed at one of the different image formation positions, an other one of the P-polarized wave and the S-polarized wave at an other one of the different image formation positions by using a mirror; capturing an image of the one of the P-polarized wave and the S-polarized wave by using a first image sensor; and capturing an image of the other one of the P-polarized wave and the S-polarized wave by using a second image sensor.

According to yet another aspect of the present invention, a pattern inspection method includes illuminating a mask substrate for exposure, on which a pattern is formed, with a first illumination light; receiving a first transmitted light, being the first illumination light having passed through the mask substrate, by an objective lens; arranging a P-polarized wave and an S-polarized wave of the first transmitted light having passed through the objective lens to be in mutually orthogonal directions, by using a division type half-wave plate arranged opposite to the mask substrate with respect to the objective lens, and close to a pupil position of the objective lens; separating a trajectory of the P-polarized wave from a trajectory of the S-polarized wave by using a Rochon prism; focusing and forming images of the P-polarized wave and the S-polarized wave having passed through the Rochon prism at image formation positions different from each other by using an imaging lens; reflecting, in a case where one of the P-polarized wave and the S-polarized wave is focused and formed at one of the different image formation positions, an other one of the P-polarized wave and the S-polarized wave at an other one of the different image formation positions by using a mirror; capturing an image of the one of the P-polarized wave and the S-polarized wave by using a first image sensor; capturing an image of the other one of the P-polarized wave and the S-polarized wave by using a second image sensor; moving the division type half-wave plate and the Rochon prism from an inside to an outside of an optical path; moving a beam splitter from the outside to the inside of the optical path; illuminating the mask substrate with a second illumination light by using a transmission inspection illumination optical system; illuminating the mask substrate with a third illumination light by using a reflection inspection illumination optical system; receiving a second transmitted light, being the second illumination light having passed through the mask substrate, and a reflected light, being the third illumination light having been reflected from the mask substrate, by the imaging lens through the objective lens and the light splitter; focusing and forming an image of one of the second transmitted light and the reflected light at the one of the different image formation positions which is corresponding to the one of the P-polarized wave and the S-polarized wave, and focusing and forming an image of an other one of the second transmitted light and the reflected light at the other one of the different image formation positions, by using the imaging lens; reflecting the other one of the second transmitted light and the reflected light, at the other one of the different image formation positions, by using the mirror; capturing an image of the one of the second transmitted light and the reflected light by using the first image sensor; and capturing an image of the other one of the second transmitted light and the reflected light by using the second image sensor.

DETAILED DESCRIPTION OF THE INVENTION

Figure 1:
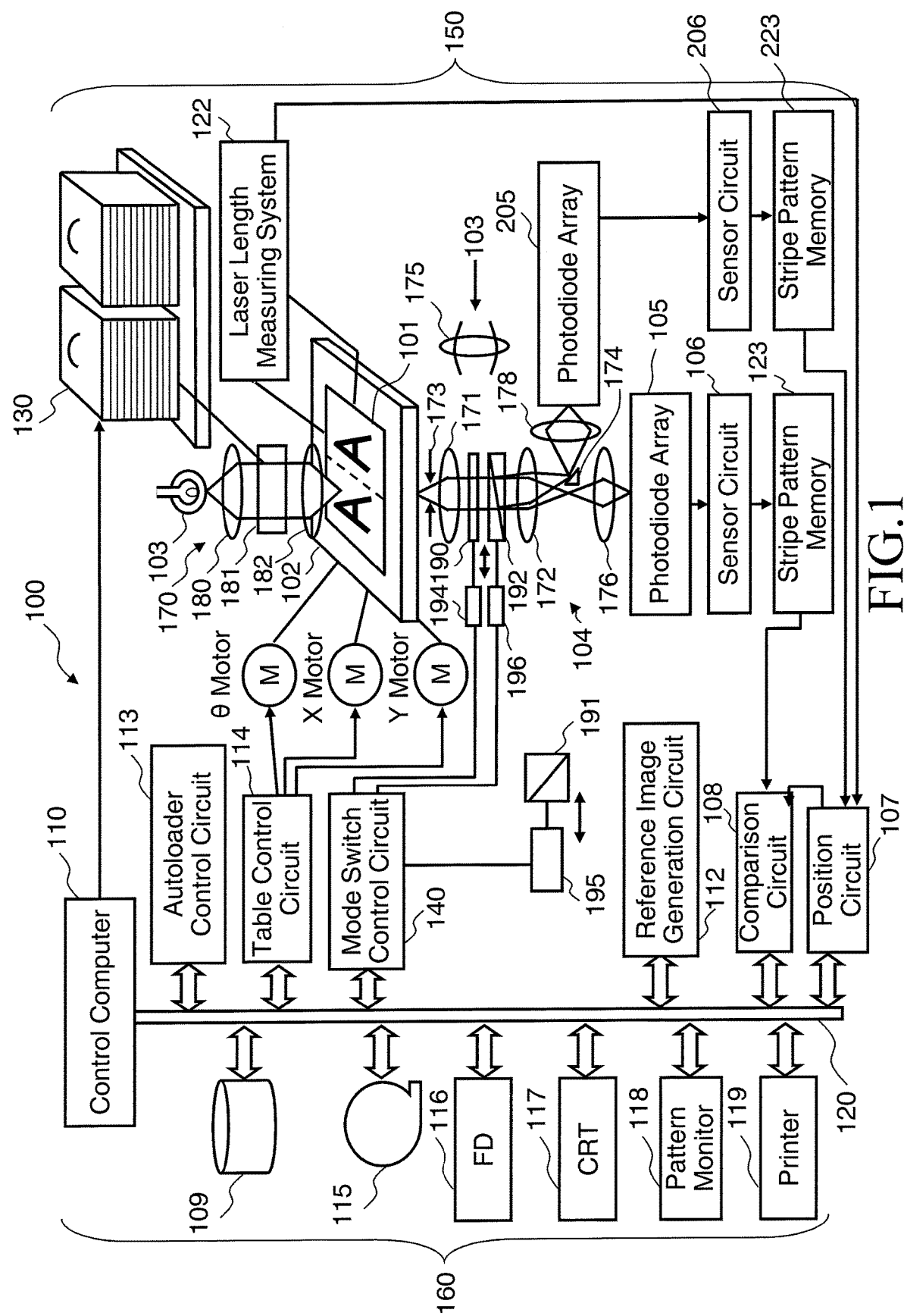
FIG. 1 illustrates a configuration of a pattern inspection apparatus according to a first embodiment.

As described above, it is requested to reproduce a pattern image which is to be transfer printed by the exposure apparatus. Then, in order to generate an exposure image to be transfer printed by the exposure apparatus, the present inventor has filed a patent application (Japanese Patent Application No. 2015-218287) regarding a method for capturing images after performing separation between the P and S polarized waves, though which is not yet publicly known at the priority date of the present invention under the Paris Convention. By the method described in the filed application, although it becomes possible to perform imaging (capture an image) the P and S polarized waves simultaneously, the method of image capturing while separating the P and S polarized waves is not limited to the filed method. Therefore, it is also requested to develop in other configurations the method of image capturing after separating the P and S polarized waves.

Although it becomes possible to perform imaging the P and S polarized waves simultaneously according to the method described in the filed application, if performing a general pattern inspection where a pattern image, not a polarized image, is captured to be compared, it becomes difficult to conduct a transmission inspection and a reflection inspection simultaneously. In the transmission inspection and the reflection inspection, different positions on the target object surface are simultaneously irradiated with respective inspection beams, and imaging is performed treating a pattern at one of the different positions as a transmitted image, and a pattern at the other of the different positions as a reflected image. Thereby, since the images do not overlap each other in transmission and reflection, each image can be captured with great precision. However, in the method where imaging is performed while performing separation between the P and S polarized waves, if the same image-forming optical system is used to separate an image at one position into a P-polarized wave and an S-polarized wave, the image formation position is displaced from that of the image in the case of simultaneously performing a transmission inspection and a reflection inspection. Therefore, it is requested to develop a new mechanism which can use an image-forming optical system in common between polarized image acquisition and general pattern inspection.

Embodiments below describe an apparatus and method which acquires a polarized image to be used for generating an exposure image exposed and transferred by the exposure apparatus. Moreover, Embodiments below describe an apparatus and method which can use the image-forming optical system in common between polarized image acquisition and general pattern inspection. In the below-described embodiments, the polarization component whose polarization direction (oscillation direction of the electric field or magnetic field) is in a tangential direction of a circumference centering on the optical axis of a transmitted light is defined as an S-polarized wave (S-polarized component). The polarization component whose polarization direction is in a radial direction (radiation direction) of a circle centering on the optical axis of a transmitted light is defined as a P-polarized wave (P-polarized component). In other words, the P-polarized wave and the S-polarized wave intersect perpendicularly at any position in the circle of a transmitted light in the plane orthogonal to the traveling direction of a transmitted light.

FIRST EMBODIMENT

FIG. 1 illustrates a configuration of a pattern inspection apparatus according to a first embodiment. As shown in FIG. 1, an inspection apparatus 100 that inspects defects of a pattern formed on a mask substrate 101 includes an optical image acquisition mechanism 150 and a control system circuit 160 (control circuit).

The optical image acquisition mechanism 150 (polarized image acquisition device) includes a light source 103, a transmission inspection illumination optical system 170

(transmission illumination optical system), a reflection inspection illumination optical system 175 (reflection illumination optical system), an XYθ table 102 arranged movably, a diaphragm (aperture stop) 173, a magnifying optical system 104, a division type half-wave plate 190 (division type λ/2 wave plate), a Rochon prism 192, a mirror 174, a beam splitter 191, transmission mechanisms 194, 195, and 196, two photodiode arrays 105 and 205 (example of a sensor), two sensor circuits 106 and 206, two stripe pattern memories 123 and 223, and a laser length measuring system 122. The mask substrate 101 is placed on the XYθ table 102. The mask substrate 101 is, for example, an exposure photomask used for transfer printing a pattern onto a semiconductor substrate, such as a wafer. A pattern composed of a plurality of figure patterns to be inspected is formed on the photomask. Here, two identical patterns are formed right and left. The mask substrate 101 is arranged, for example, with its pattern forming surface facing downward, on the XYθ table 102.

The transmission inspection illumination optical system 170 includes a projection lens 180, an illumination shape switching mechanism 181, and an imaging lens 182. Moreover, the transmission inspection illumination optical system 170 may also include other lenses, mirrors, and/or optical elements. The reflection inspection illumination optical system 175 includes at least one lens which illuminates a target with a reflection inspection illumination light separated from a transmission inspection illumination light emitted from the light source 103. The reflection inspection illumination optical system 175 may also include other lenses, mirrors, and/or optical elements.

The magnifying optical system 104 includes an objective lens 171, and imaging lenses 172, 176, and 178. Each of the objective lens 171, and the imaging lenses 172, 176, and 178 is composed of at least one lens. Moreover, the magnifying optical system 104 may include other lenses and/or mirrors between the objective lens 171 and the imaging lens 172, between the imaging lens 172 and the imaging lens 176, and/or between the imaging lens 172 and the imaging lens 178.

In the control system circuit 160, a control computer 110 is connected, through a bus 120, to a position circuit 107, a comparison circuit 108, a reference image generation circuit 112, an autoloader control circuit 113, a table control circuit 114, a mode switching control circuit 140, a magnetic disk device 109, a magnetic tape device 115, a flexible disk device (FD) 116, a CRT 117, a pattern monitor 118, and a printer 119. The sensor circuit 106 is connected to the stripe pattern memory 123 which is connected to the comparison circuit 108. Similarly, the sensor circuit 206 is connected to the stripe pattern memory 223 which is connected to the comparison circuit 108. The XYθ table 102 is driven by the motors of the X-axis, Y-axis, and θ-axis.

The transmission mechanism 194 moves the division type half-wave plate 190 from the inside to the outside of the optical path, and from the outside to the inside of the optical path, under the control of the mode switching control circuit 140. The transmission mechanism 196 moves the Rochon prism 192 from the inside to the outside of the optical path, and from the outside to the inside of the optical path, under the control of the mode switching control circuit 140. The transmission mechanism 195 moves the beam splitter 191 from the inside to the outside of the optical path, and from the outside to the inside of the optical path, under the control of the mode switching control circuit 140.

According to the first embodiment, an inspection (polarized image inspection mode (1)) which acquires a polarized image to be used, and an inspection (general inspection mode (2)) which captures a pattern image of high magnification to be inspected are configured in a switchable manner. In the case of the polarized image inspection mode (1), in the inspection apparatus 100, an inspection optical system of high magnification is composed of the light source 103, the transmission inspection illumination optical system 170, the XYθ table 102, the diaphragm 173, the magnifying optical system 104, the division type half-wave plate 190, the Rochon prism 192, the mirror 174, the photodiode arrays 105 and 205, and the sensor circuits 106 and 206. In the case of the general inspection mode (2), in the inspection apparatus 100, an inspection optical system of high magnification is composed of the light source 103, the transmission inspection illumination optical system 170, the reflection inspection illumination optical system 175, the XYθ table 102, the magnifying optical system 104, the beam splitter 191, the mirror 174, the photodiode arrays 105 and 205, and the sensor circuits 106, and 206. For example, an inspection optical system with magnification of 400 to 500 times is configured.

The XYθ table 102 is driven by the table control circuit 114 under the control of the control computer 110. The XYθ table 102 can be moved by a drive system such as a three-axis (X, Y, and θ) motor, which drives the table in the directions of x, y, and θ. For example, a linear motor can be used as each of these X, Y, and θ motors. The XYθ table 102 is movable in the horizontal direction and the rotation direction by the motors of the X-, Y-, and θ-axis. The focus position (optical axis direction: Z axis direction) of the objective lens 171 is dynamically adjusted to be on the pattern forming surface of the mask substrate 101 by the automatic focus (AF) control circuit (not shown) under the control of the control computer 110. The focus position of the objective lens 171 is adjusted when moved in optical axis direction (Z axis direction) by the piezoelectric element (not shown), for example. The movement position of the mask substrate 101 placed on the XYθ table 102 is measured by the laser length measuring system 122, and supplied to the position circuit 107.

Design pattern data (writing data) used as the basis of pattern formation of the mask substrate 101 is input from outside the inspection apparatus 100 into the magnetic disk drive 109 to be stored therein.

FIG. 1 shows configuration elements necessary for describing the first embodiment. It should be understood that other configuration elements generally necessary for the inspection apparatus 100 may also be included therein.

Figure 2A:
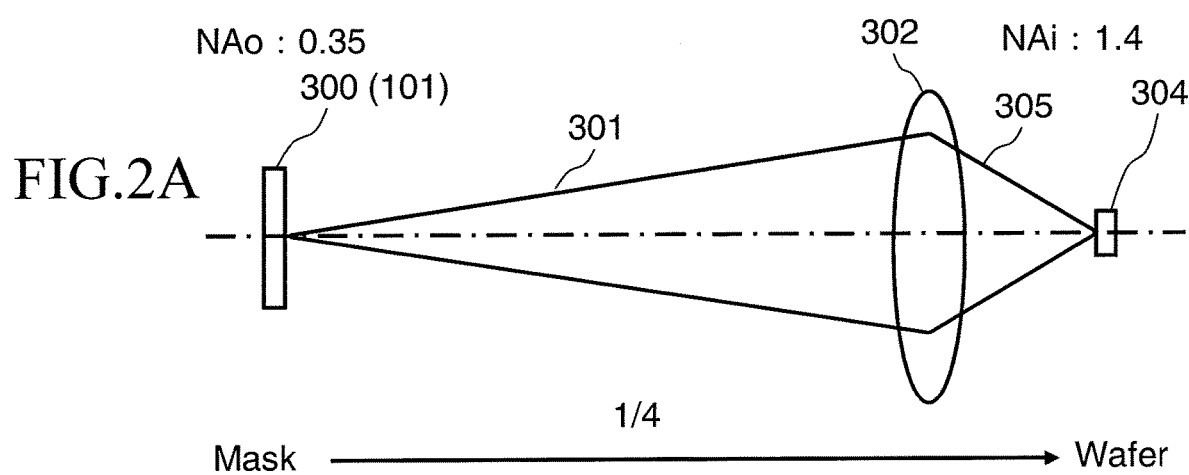
FIGS. 2A and 2B show comparison between a numerical aperture of an inspection apparatus and a numerical aperture of an exposure apparatus according to the first embodiment.
Figure 2B:
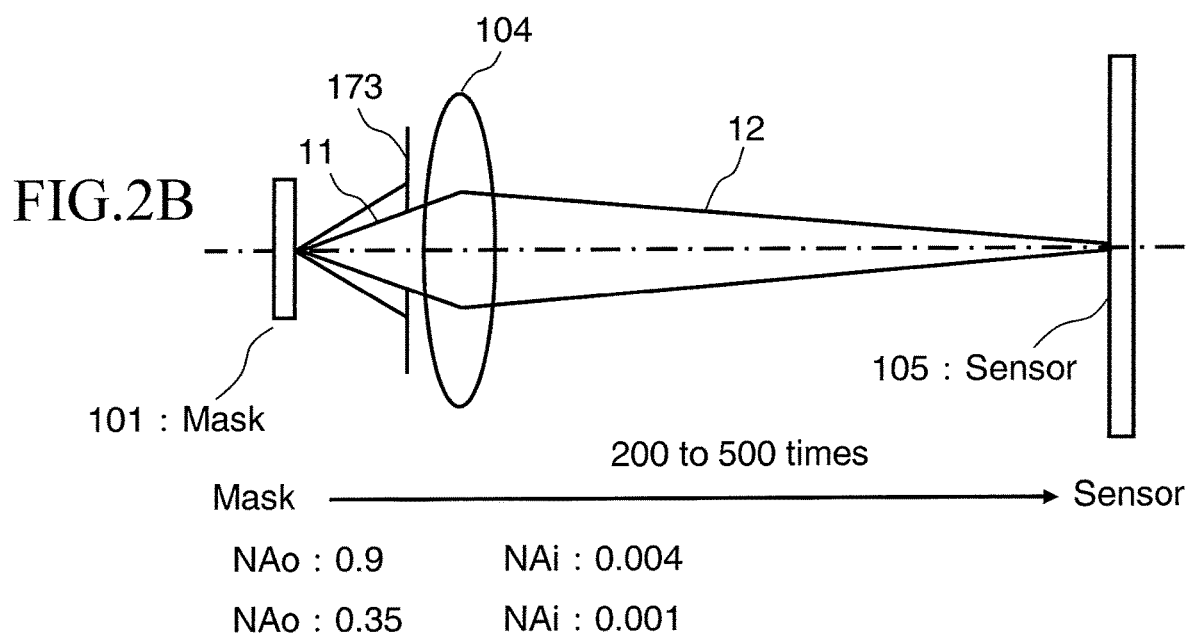

FIGS. 2A and 2B show comparison between the numerical aperture of the inspection apparatus and the numerical aperture of the exposure apparatus according to the first embodiment. FIG. 2A shows a part of the optical system of the exposure apparatus such as a stepper which exposes (transfers) a pattern formed on a mask substrate 300 to a semiconductor substrate. In the exposure apparatus, the mask substrate 300 is illuminated with an illumination light (not shown), a transmitted light 301 from the mask substrate 300 enters an objective lens 302, and a light 305 having passed through the objective lens 302 forms an image on a semiconductor substrate 304 (wafer: substrate to be exposed, exposure substrate)). Although FIG. 2A shows the objective lens 302 (reduction optical system) composed of only one lens, it is, of course, also preferable to combine a plurality of lenses to configure the objective lens 302. In the currently-used exposure apparatus, a pattern formed on the mask substrate 300 is reduced to, for example, ¼ to be exposed and transferred to the semiconductor substrate 304.

In this regard, the numerical aperture NAi (image "i" side numerical aperture) with respect to the semiconductor substrate 304 of the exposure apparatus is set to, for example, NAi=1.4. In other words, the numerical aperture NAi (image "i" side numerical aperture) of the objective lens 302, which can pass through the objective lens 302, is set, for example, to NAi=1.4. Since a transmitted light image from the mask substrate 300 is reduced to ¼ in the exposure apparatus, the sensitivity of the objective lens 302 with respect to the mask substrate 300 becomes ¼. In other words, the numerical aperture NAo (object "o" side numerical aperture) of the objective lens 302, with which a transmitted light from the mask substrate 300 can enter the objective lens 302, is ¼ of NAi, namely, NAo=0.35. Accordingly, it indicates that a transmitted light image of a light flux of numerical aperture NAo=0.35 from the mask substrate 300 is exposed and transferred, as an image of a light flux of very large numerical aperture NAi=1.4, to the semiconductor substrate 304 in the exposure apparatus.

On the other hand, in the inspection apparatus 100 according to the first embodiment, whose part is shown in FIG. 2B, the mask substrate 101 is illuminated with an illumination light (not shown), a transmitted light 11 from the mask substrate 101 enters the magnifying optical system 104 including an objective lens, and a light 12 having passed through the magnifying optical system 104 forms an image on the photodiode array 105 (image sensor). In that case, the numerical aperture NAo (object "o" side numerical aperture) of the objective lens, with which the transmitted light 11 from the mask substrate 101 can enter the magnifying optical system 104, is set to NAo=0.9, for example. Since, in the inspection apparatus 100, a transmitted light image from the mask substrate 300 is magnified 200 to 500 times to be compared in the inspection, the sensitivity of the magnifying optical system 104 with respect to the mask substrate 101 is 200 to 500. Therefore, the numerical aperture NAi (image "i" side numerical aperture) of the magnifying optical system 104 with respect to the photodiode array 105 is 1/500 to 1/200 of NAo, that is, the numerical aperture NAi=0.004, for example.

Thus, the information amount of light obtained by the objective lens 302 with NAo=0.35 of the exposure apparatus originally differs from the information amount of light obtained by the objective lens 302 with NAo=0.9 of the inspection apparatus 100. Therefore, it is difficult for the image on the semiconductor substrate 304 and the image on the light receiving surface of the photodiode array 105 to be the same image because their numbers of light fluxes are different. Then, in order to make the objective lens of the inspection apparatus 100 equal to the objective lens 302 of the exposure apparatus, NAo of the objective lens of the inspection apparatus 100 is set to, for example, NAo=0.35 by stopping down the light flux with the diaphragm 173. Thereby, the numbers of the light fluxes can be equal to each other. However, in the inspection apparatus 100, since the transmitted light image from the mask substrate 300 has been magnified 200 to 500 times in order to be compared in the inspection, the sensitivity of the magnifying optical system 104 with respect to the mask substrate 101 is 200 to 500. Therefore, the numerical aperture NAi (image "i" side numerical aperture) of the magnifying optical system 104 with respect to the photodiode array 105 becomes 1/500 to 1/200 of NAo, for example, that is NAi=0.001, while not becoming a very large numerical aperture NAi=1.4 such as the objective lens 302 of the exposure apparatus. Thus, the numerical aperture NAi (image "i" side numerical aperture) of the magnifying optical system 104 with respect to the photodiode array 105 becomes sufficiently smaller than that of the objective lens 302 (reduction optical system) of the exposure apparatus. Although FIG. 2B shows only the magnifying optical system 104, a plurality of lenses are arranged in the magnifying optical system 104. As described above, the magnifying optical system 104 includes at least the objective lens 171, and the imaging lenses 172 and 176 (and imaging lens 178).

The transmitted light 190 which is an illumination light focused on the mask substrate 101 and passed through the mask substrate 101 enters the objective lens 171 with the same numerical aperture NAo (NAo=0.35) as that in the case when the mask substrate 101 is arranged in the exposure apparatus, the objective lens 302 of the exposure apparatus, which is for receiving a transmitted light from the mask substrate 101 and forming an image on the semiconductor substrate 304, receives the transmitted light 301 from the mask substrate 101. The imaging lens 176 (and imaging lens 178) makes the beam having passed through the inside of the magnifying optical system 104 be focused with the numerical aperture NAi (NAi=0.001) sufficiently smaller than that of the objective lens 302 of the exposure apparatus.

Figures 3, 4:
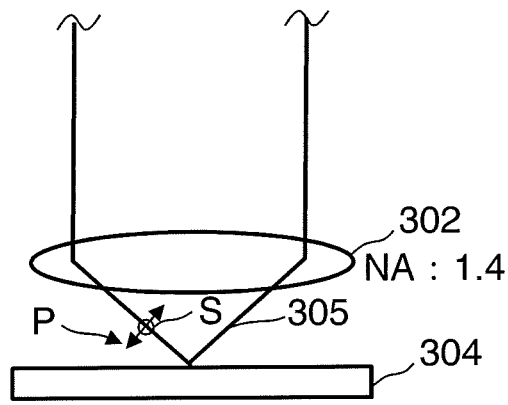
FIG. 3 illustrates features of an S-polarized wave and a P-polarized wave in a comparative example with respect to the first embodiment.
FIG. 4 shows comparison between relations among an image side numerical aperture, an S-polarized wave, and a P-polarized wave in the first embodiment and a comparative example.

FIG. 3 illustrates features of the S-polarized wave and the P-polarized wave in a comparative example with respect to the first embodiment. FIG. 3 illustrates an example of a state in which the light 305 having passed through the objective lens 302 of the exposure apparatus being a comparative example is formed (focused) on the semiconductor substrate 304. Since the numerical aperture NAi (image "i" side numerical aperture) of the objective lens 302 with respect to the semiconductor substrate 304 is a very large numerical aperture NAi=1.4, the amplitude of especially a P-polarized component of the light 305 is reduced, eliminated, or inverted due to the effect of light interference.

FIG. 4 shows comparison between relations among an image side numerical aperture, an S-polarized wave, and a P-polarized wave in the first embodiment and a comparative example. In the exposure apparatus, as described above, since the numerical aperture NAi of the objective lens 302 at the side of the semiconductor substrate 304 is a very large NAi=1.4, the amplitude of the P-polarized component is reduced, eliminated, or inverted as shown in FIG. 4. By contrast, the amplitude of the S-polarized component maintains the same state regardless of the numerical aperture NAi of the objective lens 302 at the side of the semiconductor substrate 304.

On the other hand, in the inspection apparatus 100, as described above, since the numerical aperture NAi of the magnifying optical system 104 at the side of the photodiode array 105 is a very (sufficiently) small NAi=0.001 compared with that of the objective lens 302 of the exposure apparatus, the amplitude of the P-polarized component is not reduced, eliminated, or inverted. The amplitude of the S-polarized component similarly maintains the same state.

Since both the light of a mask pattern image formed (focused) on the semiconductor substrate 304 in the exposure apparatus, and the light of a mask pattern image formed (focused) on the photodiode array 105 in the inspection apparatus 100 are combined lights each composed of a P-polarized component and an S-polarized component, if P-polarized components of the light of the mask pattern images are different, optical images obtained are not the same.

In light of this phenomenon, according to the first embodiment, in the inspection apparatus 100, the mask pattern image focused (formed) on the photodiode array 105 is separated to be acquired into an image of a P-polarized component and an image of an S-polarized component. Thereby, by adjusting a combining method (rate), etc. of the P-polarized component and the S polarized component, it becomes possible to generate an exposure image from two kinds of images captured on the photodiode array 105.

Figure 5:
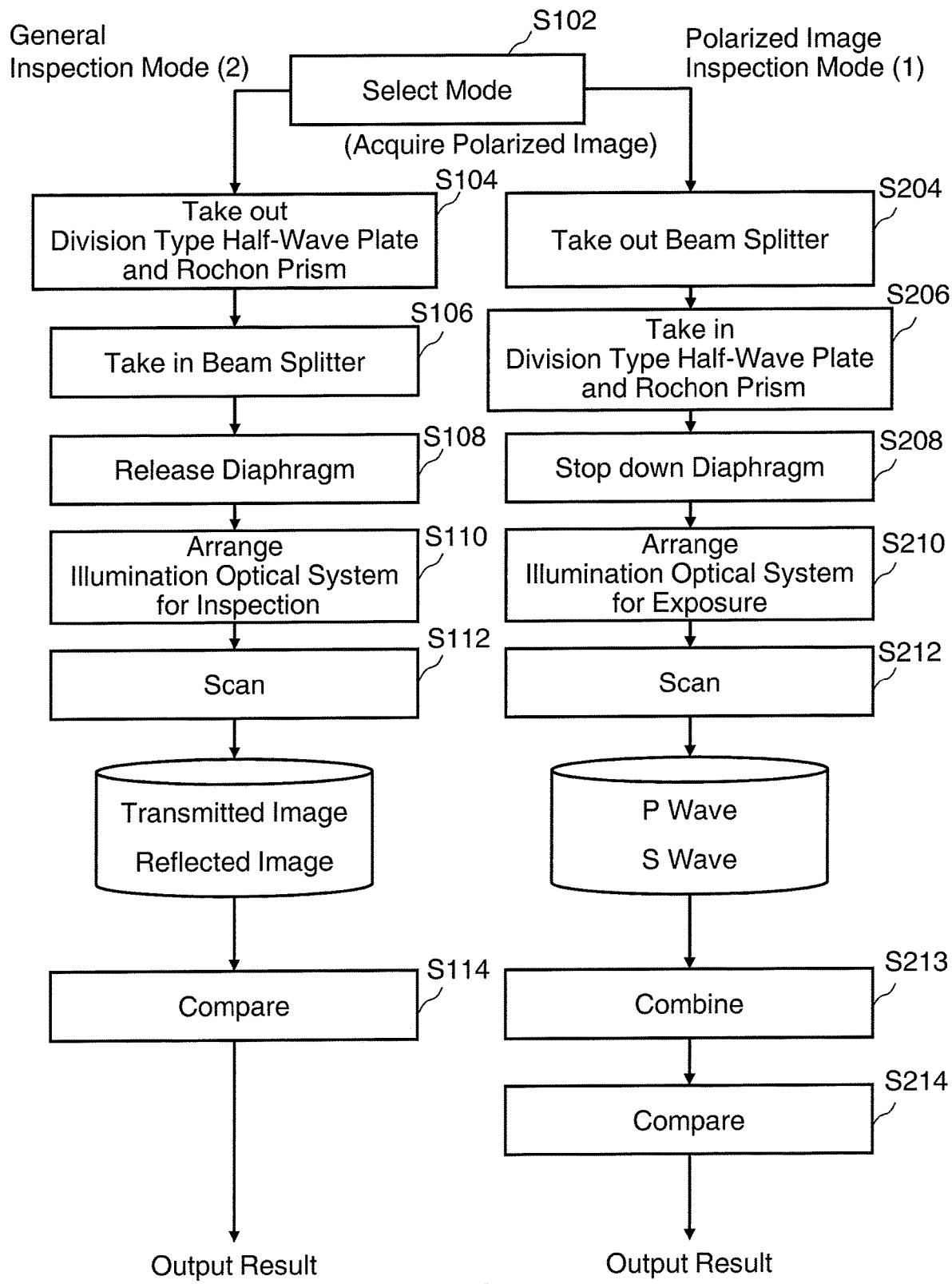
FIG. 5 is a flowchart showing main steps of a pattern inspection method according to the first embodiment.

FIG. 5 is a flowchart showing main steps of a pattern inspection method according to the first embodiment. In FIG. 5, the pattern inspection method of the first embodiment executes each step of a mode selection step (S102), a taking-out step (S104), a taking-in step (S106), a diaphragm release step (S108), an illumination optical system switching step (S110), a scanning step (S112), a comparison step (S114), a taking-out step (S204), a taking-in step (S206), a diaphragm stopping-down step (S208), an illumination optical system switching step (S210), a scanning step (S212), a combining step (S213), and a comparison step (S214).

In the mode selection step (S102), if a polarized image inspection mode (1) is selected in which a polarized image is acquired to be used, the polarized image inspection mode (1) executes, in the steps of FIG. 5, each of the taking-out step (S204), the taking-in step (S206), the diaphragm stopping-down step (S208), the illumination optical system switching step (S210), the scanning step (S212), the combining step (S213), and the comparison step (S214).

In the mode selection step (S102), if a general inspection mode (2) is selected in which a pattern image of high magnification is captured to be inspected, the general inspection mode (2) executes, in the steps of FIG. 5, each of the taking-out step (S104), the taking-in step (S106), the diaphragm release step (S108), the illumination optical system switching step (S110), the scanning step (S112), and the comparison step (S114).

Therefore, first, in the mode selection step (S102), one of the polarized image inspection mode (1) and the general inspection mode (2) is selected by a user. For example, the user may select one of the inspection modes (1) and (2) through a keyboard, a mouse, a touch panel, or the like (not shown). Information on the selected inspection mode is output to the mode switching control circuit 140 under the control of the control computer 110. Based on the information on the input inspection mode, the mode switching control circuit 140 switches adjustment, etc. of the inspection optical system. First, the case of selecting the polarized image inspection mode (1) will be described.

Figure 6:
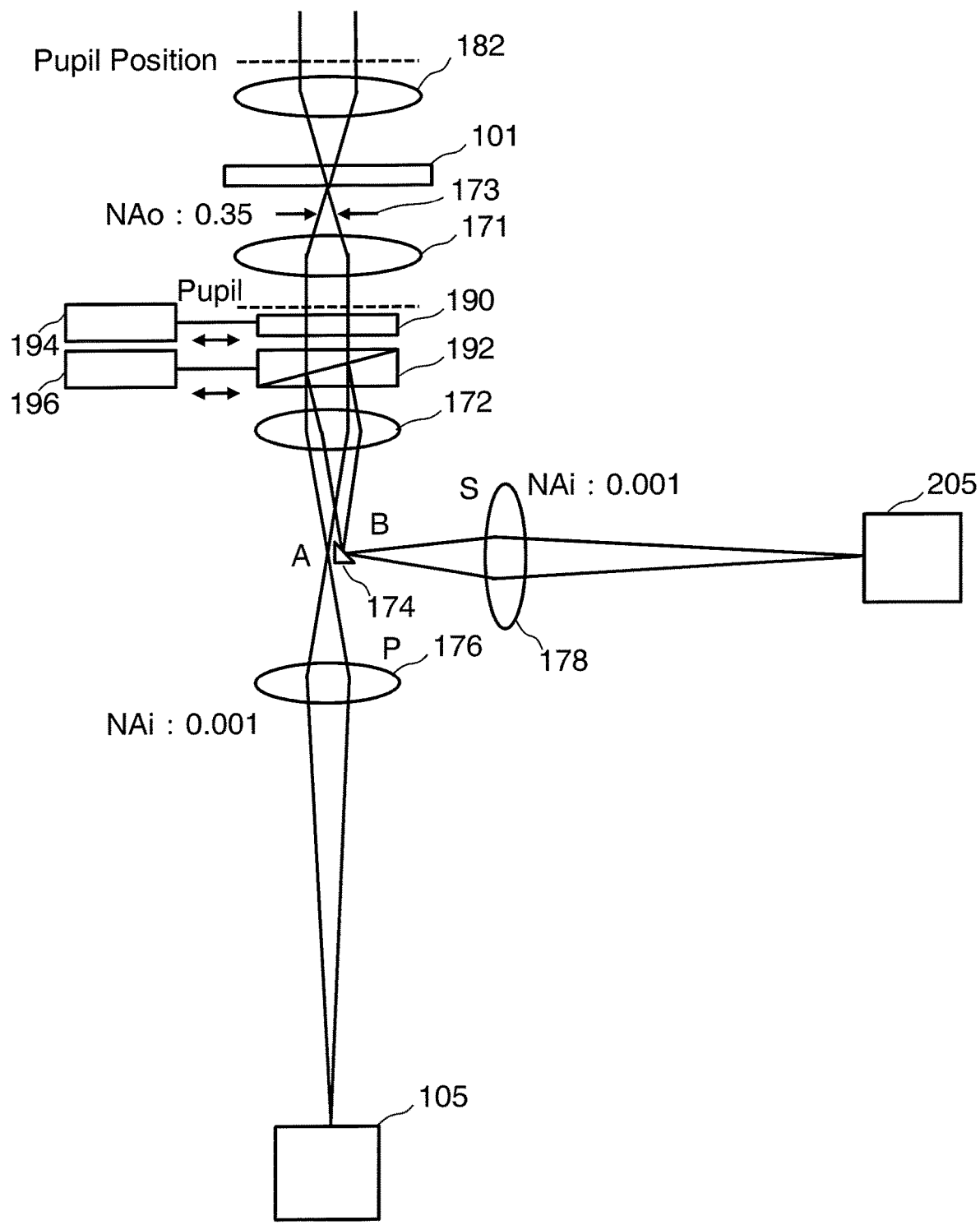
FIG. 6 shows an example of a configuration of an inspection optical system in a polarized image inspection mode according to the first embodiment.

FIG. 6 shows an example of the configuration of the inspection optical system in the polarized image inspection mode according to the first embodiment. FIG. 6 shows a part of the configuration of FIG. 1. In FIG. 6, the dotted line indicates a pupil position from each lens. Reduction scales, etc. of positions of respective configuration elements in FIGS. 1 and 6 are not coincident with each other.

In the taking-out step (S204), the transmission mechanism 195 moves the beam splitter 191 from the inside to the outside of the optical path, under the control of the mode switching control circuit 140. If the beam splitter 191 is arranged outside the optical path from the first, this operation is to be omitted.

In the taking-in step (S206), the transmission mechanism 194 moves the division type half-wave plate 190 from the outside to the inside of the optical path, under the control of the mode switching control circuit 140. The division type half-wave plate 190 is positioned opposite to the mask substrate 101 with respect to the objective lens 171, and close to the pupil position of the objective lens 171.

The transmission mechanism 196 moves the Rochon prism 192 from the outside to the inside of the optical path, under the control of the mode switching control circuit 140. Specifically, the Rochon prism 192 is placed close to the space region in the optical path which is made by taking out the beam splitter 191 from the inside to the outside of the optical path.

In the diaphragm stopping-down step (S208), the mode switching control circuit 140 makes NAo of the objective lens 171 equal to that of the objective lens 302 of the exposure apparatus by narrowing the diameter of the aperture of the diaphragm 173 in order to reduce the number of the light fluxes which can pass therethrough. For example, NAo of the objective lens of the inspection apparatus 100 is set to NAo=0.35.

In the illumination optical system switching step (S210), the illumination shape switching mechanism 181 switches optical elements including a lens, a mirror, etc. so that the shape of an illumination light (inspection light) for transmission inspection may be the same as that used in the exposure apparatus. Such optical elements should be arranged in a switchable manner to be in accordance with illumination conditions of the exposure apparatus.

In the scanning step (S212), the optical image acquisition mechanism 150 acquires an optical image of a pattern formed on the mask substrate 101. Specifically, it operates as described below.

In FIG. 6, there is generated a laser light (e.g., DUV light) being an inspection light from the light source 103, whose wavelength is equal to or shorter than that of the ultraviolet region. The illumination shape switching mechanism 181 is illuminated with the generated light by the projection lens 180, where the shape of the illumination light (inspection light) is changed, by the illumination shape switching mechanism 181, to be the same as that used in the exposure apparatus. The illumination light (first illumination light) whose illumination shape is the same as that used in the exposure apparatus is focused (formed), by the imaging lens 182, on the pattern forming surface of the mask substrate 101, from the back side opposite to the pattern forming surface of the mask substrate 101. The transmitted light (mask pattern image) having passed through the mask substrate 101 enters the objective lens 171 whose numerical aperture NAo has been stopped down, by the diaphragm 173, to be the same numerical aperture NAo (NAo=0.35) as that in the case where a transmitted light from the mask substrate 101 is incident to the objective lens 302 (reduction optical system) of the exposure apparatus, and is projected in parallel onto the division type half-wave plate 190 by the objective lens 171. Therefore, the optical conditions of the inspection apparatus 100 up to this stage can be the same as those of the exposure apparatus.

Then, the division type half-wave plate 190 arranges the P-polarized wave and the S-polarized wave of a transmitted light after passing through the objective lens 171 to be in mutually orthogonal directions. By making them be in orthogonal directions, it is possible to prepare the prior environment such that the P-polarized wave is separated to remain from the other component of the transmitted light. Alternatively, it is possible to prepare the prior environment such that the S-polarized wave is separated to remain from the other component of the transmitted light.

Figure 7A:
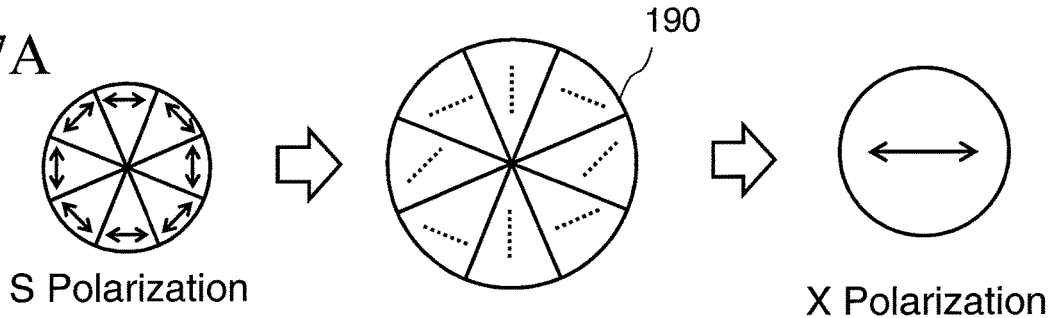
FIGS. 7A and 7B show examples of a configuration of a division type half-wave plate, and the state of a polarization component according to the first embodiment.
Figure 7B:
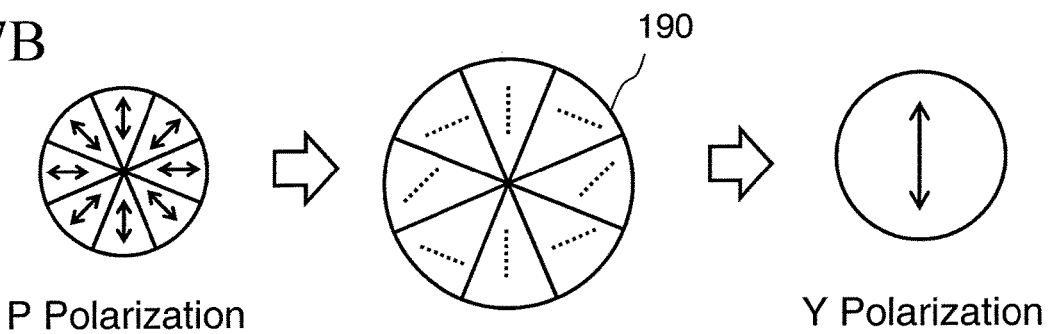

FIGS. 7A and 7B show examples of the configuration of a division type half-wave plate, and the state of a polarization component according to the first embodiment. Each example of FIGS. 7A and 7B shows a half-wave plate of eight-division type as an example of the division type half-wave plate 190. As shown in FIG. 7A, the half-wave plate 190 of eight-division type is divided into eight regions, and orientations of the fast axes each shown by a dotted line in each region are different from each other. As shown in FIG. 7A, each direction of the S-polarized component is along the circumference of the transmitted light, and, by passing through the half-wave plate of eight-division type, it can be arranged in the x direction, for example. On the other hand, as shown in FIG. 7B, each direction of the P-polarized component is along the radius of the transmitted light, and, by passing through the half-wave plate of eight-division type, it can be arranged in the y direction, for example, which is orthogonal to the S-polarized component. Although the case of eight-division type is shown in FIGS. 7A and 7B, it is not limited thereto. It may be four-division type, sixteen-division type, or another type. What is necessary is to be able to arrange the P-polarized component and the S-polarized component of a transmitted light (mask pattern image) in mutually orthogonal directions.

Figure 8:
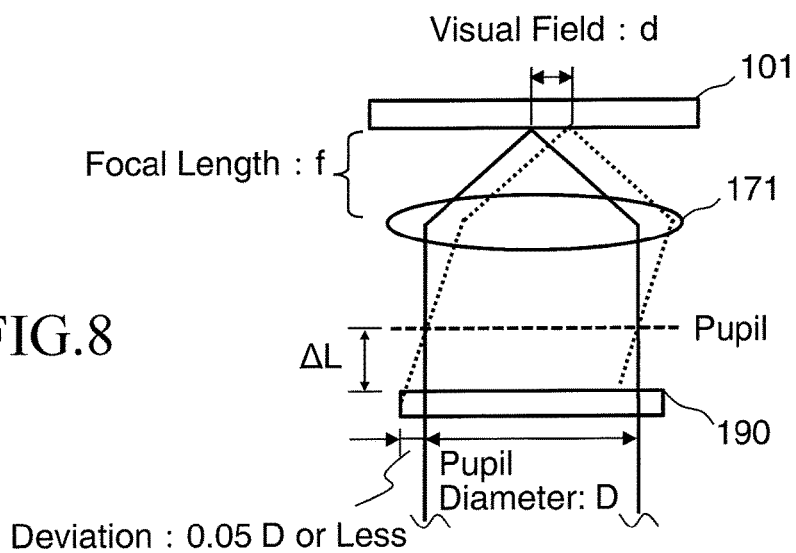
FIG. 8 illustrates an arrangement position of a division type half-wave plate according to the first embodiment.

FIG. 8 illustrates an arrangement position of a division type half-wave plate according to the first embodiment. The division type half-wave plate 190 is positioned opposite to the mask substrate 101 with respect to the objective lens 171, and close to the pupil position of the objective lens 171. The spread of the beam at the position of the division type half-wave plate 190 is preferably 5% or less of the pupil diameter D (maximum diameter of axial (on-axis) parallel light fluxes having passed through the objective lens 171) of the objective lens 171. Therefore, the deviation amount ΔL from the pupil position of the objective lens 171 in the arranged position of the division type half-wave plate 190 preferably satisfies the following equation (1) using a pupil diameter D of the objective lens 171, a visual field diameter d of the objective lens 171, and a focal length f of the objective lens 171.

$$\Delta L < 0.05 \cdot D \cdot f/d \quad (1)$$

Therefore, the division type half-wave plate 190 is preferably arranged within the deviation amount ΔL of the pupil position, from the pupil position of the objective lens 171.

A transmitted light having passed through the division type half-wave plate 190 enters the Rochon prism 192. The Rochon prism 192 separates between the trajectory of the P-polarized wave and the trajectory of the S-polarized wave of the transmitted light. In the case of FIG. 6, the P-polarized wave of the transmitted light passes as it is, and the trajectory of the S-polarized wave is bent and made to pass. The relation between the polarization component which passes without changing its trajectory and the polarization component which passes after changing the trajectory may be reversed between the P and S polarization components. Since the direction of the same polarized light wave has been arranged to be in one specific direction by the division type half-wave plate 190, the P-polarized wave and the S-polarized wave can be separated by the Rochon prism 192.

Both the P-polarized wave and the S-polarized wave having passed through the Rochon prism 192 enter the imaging lens 172. According to the first embodiment, since the direction of the trajectory of one of the P-polarized wave and the S-polarized wave (here, for example, S-polarized wave) has been changed by the Rochon prism 192, the incident position to the imaging lens 172 of the P-polarized wave and that of the S-polarized wave are different from each other. Therefore, the imaging lens 172 focuses (forms) the P-polarized wave and the S-polarized wave having passed through the Rochon prism 192 at image formation positions different from each other. In the case of FIG. 6, the imaging lens 172 focuses (forms) the P-polarized wave at the image formation position A, and the S-polarized wave at the image formation position B.

The mirror 174 is arranged at the image formation position A or the image formation position B. In the case of FIG. 6, the mirror 174 is arranged such that a reflective surface is located at the image formation position B. Then, in the state in which one of the P-polarized wave and the S-polarized wave is focused (formed) at its corresponding image formation position, the mirror 174 reflects the other one of them at the other one's corresponding image formation position. In the case of FIG. 6, the mirror 174 reflects the S-polarized wave at the image formation position B of the S-polarized wave which is different from the image formation position A of the P-polarized wave.

With respect to one (P-polarized wave in the case of FIG. 6) of the P-polarized wave and the S-polarized wave for which no mirror 174 is placed on its optical path, after it is once focused (formed) at the image formation position A, it goes straight to enter the imaging lens 176. The imaging lens 176 (first imaging lens) focuses (forms) the incident light on the photodiode array 105, with a numerical aperture (NAi=0.001) sufficiently smaller than that (NAi=1.4) of the objective lens 302 (reduction optical system) of the exposure apparatus.

The photodiode array 105 (first image sensor) captures an image (e.g., image of P-polarized component) (first image) of one of the P-polarized wave and the S-polarized wave, which is focused (formed) by the imaging lens 176.

With respect to the other one (S-polarized wave in the case of FIG. 6) of the P-polarized wave and the S-polarized wave for which the mirror 174 is placed on its optical path, after it is once focused (formed) at the image formation position B, it is reflected by the mirror 174 so as to enter the imaging lens 178. The imaging lens 178 (second imaging lens) focuses (forms) the incident light on the photodiode array 205, with a numerical aperture (NAi=0.001) sufficiently smaller than that (NAi=1.4) of the objective lens 302 (reduction optical system) of the exposure apparatus.

The photodiode array 205 (second image sensor) captures an image (e.g., image of S-polarized component) (second image) of the other one of the P-polarized wave and the S-polarized wave, which is focused (formed) by the imaging lens 178.

It is preferable to use, for example, a TDI (time delay integration) sensor, etc. as the photodiode arrays 105 and 205. The photodiode array 105 or 205 (image sensor) captures an optical image of a corresponding polarization component of a pattern formed on the mask substrate 101 in the state in which the XYθ table 102 with the mask substrate 101 thereon is moving.

Figure 9:
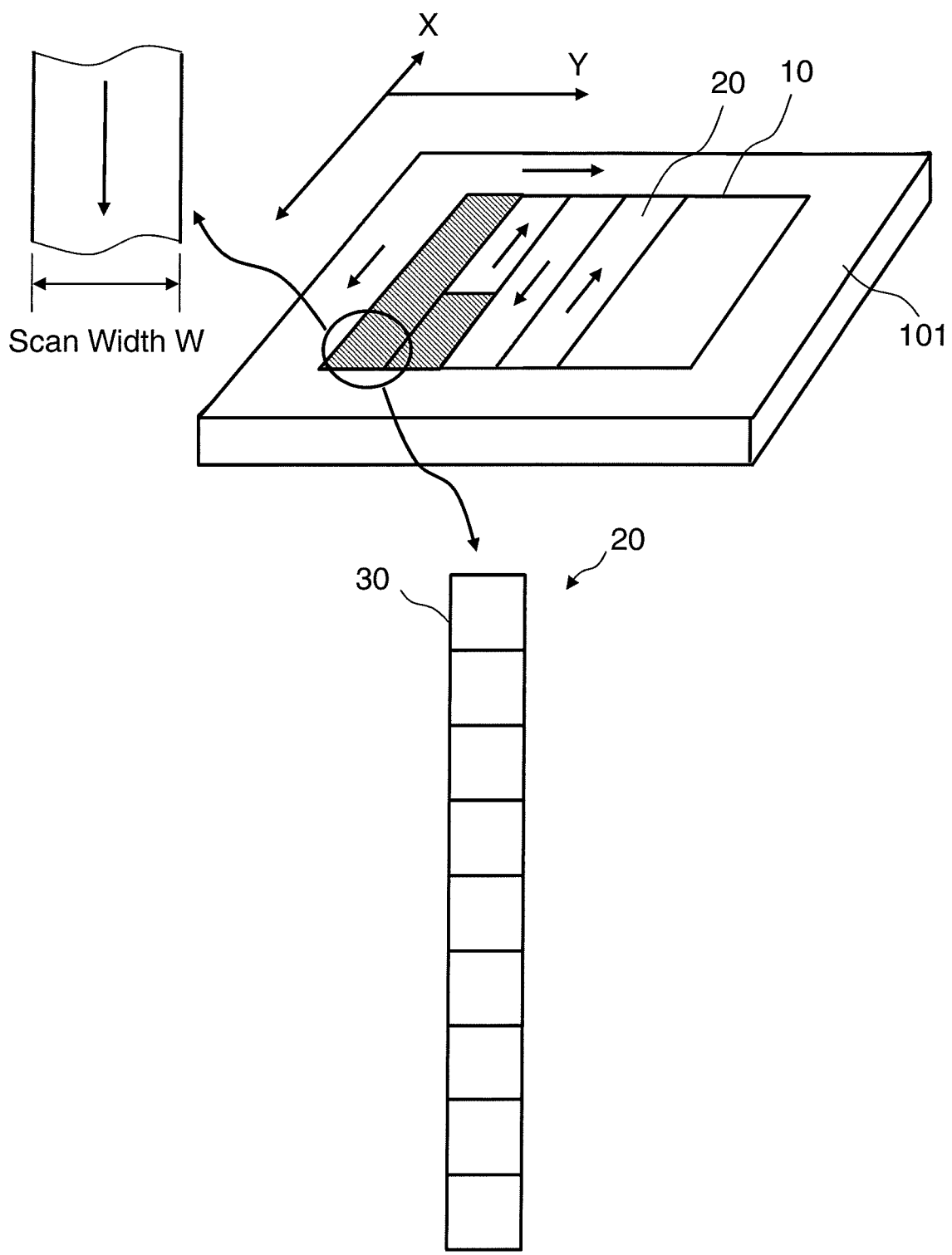
FIG. 9 is a conceptual diagram illustrating an inspection region according to the first embodiment.

FIG. 9 is a conceptual diagram illustrating an inspection region according to the first embodiment. As shown in FIG. 9, an inspection region 10 (entire inspection region) of the mask substrate 101 is virtually divided into a plurality of strip-shaped inspection stripes 20 each having a scan width W in the y direction, for example. The inspection apparatus 100 acquires an image (stripe region image) from each inspection stripe 20. That is, with respect to each of the inspection stripes 20, the inspection apparatus 100 captures an image of a figure pattern arranged in the stripe region concerned by using a laser light in the longitudinal direction (x direction) of the stripe region concerned. Then, the mask substrate 101 is moved in the x direction by the movement of the XYθ table 120, and accordingly, each of the photodiode arrays 105 and 205, which continuously moves relatively in the −x direction, acquires an optical image. Each of the photodiode arrays 105 and 205 continuously captures optical images each having a scan width W as shown in FIG. 9. In other words, while moving relatively to the XYθ table 102, each of the photodiode arrays 105 and 205, being an example of a sensor, captures optical images of patterns formed on the mask substrate 101, by using an inspection light. According to the first embodiment, after capturing an optical image in one inspection stripe 20, each of the photodiode arrays 105 and 205 moves in the y direction to the position of the next inspection stripe 20 and similarly captures another optical image having a scan width W continuously while moving in the direction reverse to the last image capturing direction. Thereby, the image capturing is repeated in the forward (FWD) and backward (BWD) directions, namely changing the direction reversely when advancing and returning.

The direction of the image capturing is not limited to repeating the forward (FWD) and backward (BWD) movement. Images may be captured in a fixed one direction. For example, it is sufficient to repeat FWD and FWD, or alternatively, to repeat BWD and BWD.

A pattern image of P-polarized light focused (formed) on the photodiode array 105 is photoelectrically converted by each light receiving element of the photodiode array 105, and further analog-to-digital (A/D) converted by the sensor circuit 106. Then, pixel data for the inspection stripe 20 to be measured is stored in the stripe pattern memory 123. When image capturing the pixel data (stripe region image), a dynamic range where the maximum gray level is 60% incidence of the illumination light quantity, for example, is preferably used as the dynamic range of the photodiode array 105.

On the other hand, a pattern image of S-polarized light focused (formed) on the photodiode array 205 is photoelectrically converted by each light receiving element of the photodiode array 205, and further analog-to-digital (A/D) converted by the sensor circuit 206. Then, pixel data for the inspection stripe 20 to be measured is stored in the stripe pattern memory 223. When image capturing the pixel data (stripe region image), a dynamic range where the maximum gray level is 60% incidence of the illumination light quantity, for example, is preferably used as the dynamic range of the photodiode array 205.

When acquiring an optical image of the inspection stripe 20, the laser length measuring system 122 measures the position of the XYθ table 102. The measured position information is output to the position circuit 107. The position circuit 107 (calculation unit) calculates the position of the mask substrate 101 by using the measured position information.

Then, the stripe region image of P-polarized light is sent to the comparison circuit 108, with data indicating the position of the mask substrate 101 on the XYθ table 102 output from the position circuit 107. Measured data (pixel data) of P-polarized light is, for example, 8-bit unsigned data, and indicates a gray-scale level (light intensity) of brightness of each pixel. The stripe region image of P-polarized light output into the comparison circuit 108 is stored in a storage device to be described later.

Similarly, the stripe region image of S-polarized light is sent to the comparison circuit 108, with data indicating the position of the mask substrate 101 on the XYθ table 102 output from the position circuit 107. Measured data (pixel data) of P-polarized light is, for example, 8-bit unsigned data, and indicates a gray-scale level (light intensity) of brightness of each pixel. The stripe region image of S-polarized light output into the comparison circuit 108 is stored in a storage device to be described later.

As described above, according to the first embodiment, it is possible to simultaneously acquire respective polarized images of the S-polarized wave and the P-polarized wave which are the basis for generating an exposure image to be exposed and transferred by the exposure apparatus. Then, an exposure image can be generated by combining a polarized image of the S-polarized wave with a polarized image of the P-polarized wave obtained by adjusting the acquired P-polarized wave to be the P-polarized component in the state where the amplitude is reduced, eliminated, or inverted due to the objective lens 302 (reduction optical system) of the exposure apparatus. According to the first embodiment, since image-capturing is performed in the state where the S-polarized wave and P-polarized wave are separated, it is possible to adjust a polarization component image of one of the S-polarized wave and the P-polarized wave.

The inspection apparatus 100 of the first embodiment performs a pattern inspection of the mask substrate 101 by further utilizing respective polarized images of the S-polarized wave and the P-polarized wave.

Figure 10:
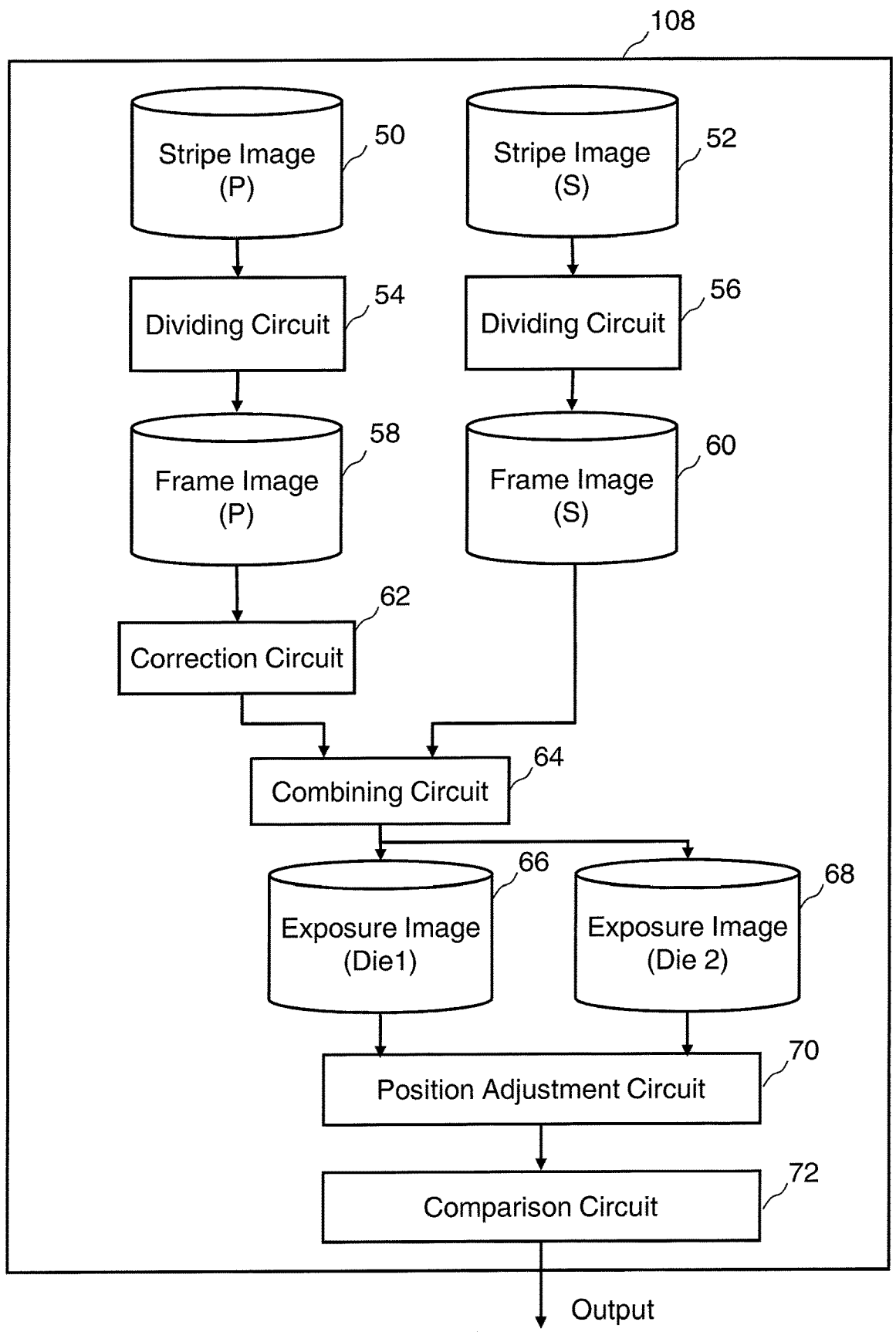
FIG. 10 shows apart of an internal configuration of a comparison circuit according to the first embodiment.

FIG. 10 shows a part of an internal configuration of a comparison circuit according to the first embodiment. In the comparison circuit 108 of FIG. 10, there are arranged storage devices 50, 52, 58, 60, 66, and 68 such as magnetic disk drives, dividing circuits 54 and 56, a correction circuit 62, a combining circuit 64, a position adjustment circuit 70, and a comparison circuit 72. FIG. 10 shows the configuration necessary for the polarized image inspection mode (1). Since the configuration necessary for the general inspection mode (2) may be the same as the conventional configuration, it is not shown in the figure.

In the comparison circuit 108, a stripe region image (optical image) of a P-polarized wave of the inspection stripe 20 is stored in the storage device 50. Then, the dividing circuit 54 (dividing unit) reads the stripe region image of the P-polarized wave, and divides it by a predetermined size (e.g., the same width as the scan width W) in the x direction. For example, it is divided into frame images each having 512×512 pixels. Thereby, a frame image of a P-polarized wave of each frame region 30 can be acquired with respect to a plurality of frame regions 30 (FIG. 9) obtained by dividing the inspection stripe 20 by the same width as the scan width W, for example. The frame image of the P-polarized wave is stored in the storage device 58.

Similarly, a stripe region image (optical image) of an S-polarized wave of the inspection stripe 20 is stored in the storage device 52. Then, the dividing circuit 56 (dividing unit) reads the stripe region image of the S-polarized wave, and divides it by a predetermined size (e.g., the same width as the scan width W) in the x direction. For example, it is divided into frame images each having 512×512 pixels. Thereby, a frame image of an S-polarized wave of each frame region 30 can be acquired. The frame image of the S-polarized wave is stored in the storage device 60.

Next, the correction circuit 62 (correction unit) reduces the gray scale value of the frame image of the P-polarized wave by a predetermined rate so that it may be adjusted to be the same image as an exposure image. The reduction rate should be a value corresponding to an amplitude quantity (ratio) of the P-polarized component which is reduced, eliminated, or inverted due to the objective lens 302 (reduction optical system) of the exposure apparatus.

In the combining step (S213), the combining circuit 64 (combining unit) combines a frame image (first optical image) of the P-polarized wave having been corrected, and a frame image (second optical image) of the S-polarized wave not having been corrected. Thus, in the die (1) (first die) to be inspected, there is generated a composite frame image (first die image) in which the frame image of the P-polarized wave and the frame image of the S-polarized wave are combined. The composite frame image of the die (1) is stored in the storage device 66.

In the first embodiment, the "die-to-die inspection" which compares data of optical images of identical patterns captured at different positions on the same mask is performed. For example, the stripe region image described above includes images of two dies where identical patterns are formed. Then, to be corresponding to the frame region 30 of the composite frame image of the die (1), a composite frame image (second die image) of the frame region 30 of the die (2) (second die) is generated in a similar manner. The composite frame image of the die (2) is stored in the storage device 68.

The position adjustment circuit 70 performs position adjustment, using a predetermined algorithm, between the composite frame image (optical image) of the die (1) to be compared, and the composite frame image (reference image) of the die (2) to be compared. For example, the position adjustment is performed using a least-squares method.

In the comparison step (S214), the comparison circuit 72 compares the composite frame image (first die image) of the die (1) and the composite frame image (second die image) of the die (2) corresponding to the composite frame image (first die image). The composite frame image (first die image) of the die (1) is obtained by combining the frame image (first optical image) of the P-polarized wave having been corrected and the frame image (second optical image) of the S-polarized wave not having been corrected in the die (1). The composite frame image (second die image) of the die (2) where the same pattern as that of the die (1) is formed is obtained by combining the frame image (first optical image) of the P-polarized wave having been corrected and the frame image (second optical image) of the S-polarized wave not having been corrected in the die (2).

With respect to the composite frame image generated in the first embodiment, it is intended that the numerical aperture NAo of the objective lens 171 is set to be adjusted to the same conditions as those of the exposure apparatus. Therefore, the numerical aperture NAo of the objective lens 171 is smaller than that of the objective lens used in the conventional pattern defect inspection apparatus with high resolution. Accordingly, since the light flux incident to the objective lens 171 is small, the resolution of an image is inferior to that of the conventional pattern defect inspection apparatus with high resolution. On the other hand, when exposing and transferring a mask pattern to a wafer in the actual exposure apparatus, if disconnection or/and short-circuiting of the circuit does not occur on the wafer by a defect, this pattern can be used as an integrated circuit. Since the composite frame image of the first embodiment is intentionally generated to be adjusted to be the same image as an exposure image exposed on the wafer by the exposure apparatus, it is sufficient to inspect whether disconnection or/and short-circuiting of the circuit occurs on the wafer or not. Therefore, the comparison circuit 72 inspects a distance between adjacent patterns, not inspecting an individual shape defect of each figure pattern. The comparison circuit 72 measures the distance between respective patterns in the composite frame image (first die image), and similarly measures the distance between respective patterns in the composite frame image (second die image). Then, it is determined whether the difference obtained by subtracting the distance between patterns corresponding to the composite frame image (second die image) from the distance between patterns of the composite frame image (first die image) is larger than a determination threshold value, and if larger, it is determined that there is a defect. Then, the comparison result is output. The comparison result may be output to the magnetic disk drive 109, the magnetic tape drive 115, the flexible disk device (FD) 116, the CRT 117, and the pattern monitor 118, or output from the printer 119.

As described above, according to the first embodiment, since each polarized image of the S-polarized wave and the P-polarized wave can be acquired, it is possible to perform a pattern inspection of the mask substrate 101 by utilizing respective polarized images of the S-polarized wave and the P-polarized wave.

Next, the case of selecting the general inspection mode (2) in the mode selection step (S102) will now be described below.

Figure 11:
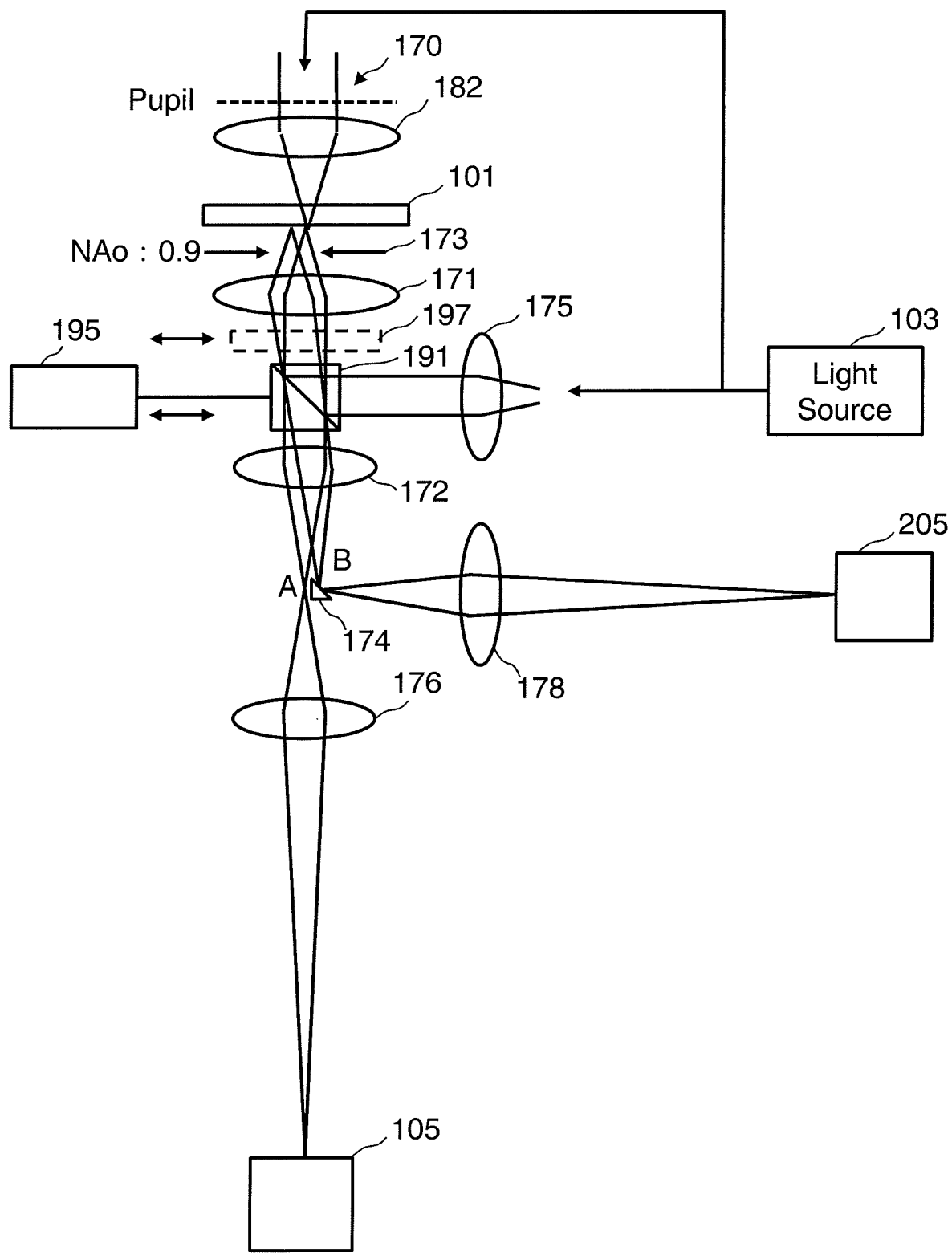
FIG. 11 shows an example of a configuration of an inspection optical system in a general inspection mode according to the first embodiment.

FIG. 11 shows an example of the configuration of the inspection optical system in the general inspection mode according to the first embodiment. FIG. 11 shows a part of the configuration of FIG. 1. Reduction scales, etc. of positions of respective configuration elements in FIGS. 1 and 11 are not coincident with each other.

In the taking-out step (S104), the division type half-wave plate 190 and the Rochon prism 192 are moved from the inside to the outside of the optical path, using a transmission mechanism which moves the division type half-wave plate 190 and the Rochon prism 192 between the inside and the outside of the optical path. Specifically, the transmission mechanism 194 (apart of first transmission mechanism) moves the division type half-wave plate 190 from the inside to the outside of the optical path, under the control of the mode switching control circuit 140. If the division type half-wave plate 190 is arranged outside the optical path from the first, this operation is to be omitted.

Moreover, the transmission mechanism 196 (a part of first transmission mechanism) moves the Rochon prism 192 from the inside to the outside of the optical path, under the control of the mode switching control circuit 140. If the Rochon prism 192 is arranged outside the optical path from the first, this operation is to be omitted.

In the taking-in step (S106), the beam splitter 191 is moved from the outside to the inside of the optical path, using a transmission mechanism which moves the beam splitter 191 between the inside and the outside of the optical path. Specifically, the transmission mechanism 195 (second transmission mechanism) moves the beam splitter 191 from the outside to the inside of the optical path, under the control of the mode switching control circuit 140. The beam splitter 191 is placed close to the space region in the optical path which is made by taking out the Rochon prism 192 from the inside to the outside of the optical path. As the beam splitter 191, a polarizing beam splitter may be used, or a non-polarizing beam splitter may be used. When using a polarizing beam splitter, it is preferable to use a quarter-wave plate 197 (λ/4 wave plate) with the polarizing beam splitter. In that case, the quarter-wave plate 197 is preferably arranged between the beam splitter 191 and the objective lens 171. By arranging the quarter-wave plate 197, a linearly polarized light having passed through the polarizing beam splitter can be converted into a circularly polarized illumination light. Thereby, the necessity of considering the relation between the polarization direction and the pattern shape of an illumination light can be eliminated. Moreover, since a reflected light being a circularly polarized light from the mask substrate 101 can be converted into a linearly polarized light, it is possible to inhibit the loss of the light quantity of the reflected light at the time of passing through the polarizing beam splitter toward the sensor side, by adjusting the arrangement angle of the quarter-wave plate 197. Also, since a transmitted light being a circularly polarized light can be converted into a linearly polarized light, it is possible to inhibit the loss of light quantity of the transmitted light at the time of passing through the polarizing beam splitter toward the sensor side.

In the diaphragm release step (S108), the mode switching control circuit 140 makes NAo of the objective lens 171 equal to that used in a general inspection with high resolution, by widening the diameter of the aperture of the diaphragm 173 in order to increase the light flux which can pass therethrough. For example, NAo of the objective lens of the inspection apparatus 100 is set to NAo=0.9. Alternatively, the aperture of the diaphragm 173 may be completely open.

In the illumination optical system switching step (S110), the illumination shape switching mechanism 181 moves optical elements for illumination of the exposure apparatus from the inside to the outside of the optical path so that the shape of an illumination light (inspection light) for transmission inspection may become the illumination shape used in general inspection. Alternatively, optical elements including a lens, a mirror, etc. are switched for general inspection.

In the scanning step (S112), the optical image acquisition mechanism 150 acquires an optical image of a pattern formed on the mask substrate 101. Specifically, it operates as described below.

In FIG. 11, there is generated a laser light (e.g., DUV light) being an inspection light from the light source 103, whose wavelength is equal to or shorter than that of the ultraviolet region. The generated light branches, by a half mirror, etc. (not shown), into an inspection light for transmission inspection, and an inspection light for reflection inspection. The inspection light for transmission inspection enters the imaging lens 182 through the illumination shape switching mechanism 181 by the projection lens 180 of the transmission inspection illumination optical system 170. The inspection light (second illumination light) for transmission inspection is focused (formed) on the pattern forming surface of the mask substrate 101, from the back side opposite to the pattern forming surface of the mask substrate 101, by the imaging lens 182 of the transmission inspection illumination optical system 170. The transmitted light (mask pattern image) having passed through the mask substrate 101 enters the objective lens 171 whose diaphragm has been released, and is projected in parallel onto the imaging lens 172, through the beam splitter 191, by the objective lens 171.

On the other hand, the inspection beam for reflection inspection (third illumination light) is projected onto the beam splitter 191 by the reflection inspection illumination optical system 175. Then, the inspection beam for reflection inspection reflected by the beam splitter 191 enters the objective lens 171, and is focused (formed) on the pattern forming surface of the mask substrate 101, from the pattern forming surface side of the mask substrate 101, by the objective lens 171. On this occasion, the inspection beam for reflection inspection is focused (formed) at a position different from that of the inspection beam for transmission inspection, on the pattern forming surface. In other words, the reflection inspection illumination optical system 175 projects an inspection beam for reflection inspection onto the beam splitter 191 such that the inspection beam for reflection inspection is focused (formed) at a position different from that of the inspection beam for transmission inspection, on the pattern forming surface of the mask substrate 101. Actually, positions very close to each other in the same stripe region 20 are illuminated with the inspection beam for transmission inspection and the inspection beam for reflection inspection. The reflected light (mask pattern image) reflected from the mask substrate 101 enters the objective lens 171 whose diaphragm has been released, and is projected in parallel onto the imaging lens 172, through the beam splitter 191, by the objective lens 171. Thus, the beam splitter 191 branches an illumination light to go to the objective lens 171, and makes a reflected light from the mask substrate 101 pass through the beam splitter 191, via the objective lens 171.

As described above, a transmitted light (second transmitted light), which is an inspection light (second illumination light) for transmission inspection having passed through the mask substrate 101, and a reflected light, which is an inspection light (third illumination light) for reflection inspection having been reflected from the mask substrate 101, enter the imaging lens 172 through the objective lens 171 and the light splitter 191. Since different positions on the mask substrate 101 are illuminated with the inspection light for transmission inspection and the inspection light for reflection inspection, when the transmitted light and reflected light from the mask substrate 101 enter the objective lens 171, their optical paths are different from each other. Therefore, it is possible to make the transmitted light and reflected light from the mask substrate 101, projected by the objective lens 171, enter at different incident positions to the imaging lens 172.

According to the first embodiment, when performing a general pattern inspection, the imaging lens 172 focuses (forms) one of a transmitted light and a reflected light (here, e.g., transmitted light) at an image formation position A which is for one of a P-polarized wave and an S-polarized wave (here, e.g., P-polarized wave), and focuses (forms) the other one of the transmitted light and the reflected light (here, e.g., reflected light) at an image formation position B which is for the other one of the P-polarized wave and the S-polarized wave (here, e.g., S-polarized wave).

In the state where one of a transmitted light and a reflected light from the mask substrate 101 is focused (formed) at its corresponding image formation position of the image formation positions A and B, the mirror 174 reflects the other one of them at the other one's corresponding image formation position of the image formation positions A and B which are different from each other. In the case of FIG. 11, the mirror 174 reflects a reflected light from the mask substrate 101 at the image formation position B of the S-polarized wave which is different from the image formation position A of the P-polarized wave.

With respect to one (transmitted light in the case of FIG. 11) of a transmitted light and a reflected light from the mask substrate 101 for which no mirror 174 is placed on its optical path, after it is once focused (formed) at the image formation position A of the P-polarized wave, it goes straight to enter the imaging lens 176. The imaging lens 176 (first imaging lens) focuses (forms) the incident light on the photodiode array 105, with a numerical aperture (NAi=0.004) for general inspection.

The photodiode array 105 (first image sensor) captures an image (e.g., image of transmitted light of mask substrate 101) (third image) of one of the transmitted light and reflected light from the mask substrate 101, which is focused (formed) by the imaging lens 176.

With respect to the other one (reflected light in the case of FIG. 11) of the transmitted light and the reflected light from the mask substrate 101 for which the mirror 174 is placed on its optical path, after it is once focused (formed) at the image formation position B of the S-polarized wave, it is reflected by the mirror 174 so as to enter the imaging lens 178. The imaging lens 178 (second imaging lens) focuses (forms) the incident light on the photodiode array 205, with a numerical aperture (NAi=0.004) for general inspection.

The photodiode array 205 (second image sensor) captures an image (e.g., image of reflected light) (fourth image) of the other one of the transmitted light and the reflected light from the mask substrate 101, which is focused (formed) by the imaging lens 178.

The respect that each of the photodiode arrays 105 and 205 continuously captures optical images each having a scan width W as shown in FIG. 9 is the same as that of the polarized image inspection mode (1). In other words, while moving relatively to the XYθ table 102, each of the photodiode arrays 105 and 205, being an example of a sensor, simultaneously captures optical images of patterns formed on the mask substrate 101, by using an inspection light for transmission and an inspection light for reflection.

A pattern image of transmitted light focused (formed) on the photodiode array 105 is photoelectrically converted by each light receiving element of the photodiode array 105, and further analog-to-digital (A/D) converted by the sensor circuit 106. Then, pixel data for the inspection stripe 20 to be measured is stored in the stripe pattern memory 123. When image capturing the pixel data (stripe region image), a dynamic range where the maximum gray level is 60% incidence of the illumination light quantity, for example, is preferably used as the dynamic range of the photodiode array 105.

On the other hand, a pattern image of reflected light focused (formed) on the photodiode array 205 is photoelectrically converted by each light receiving element of the photodiode array 205, and further analog-to-digital (A/D) converted by the sensor circuit 206. Then, pixel data for the inspection stripe 20 to be measured is stored in the stripe pattern memory 223. When image capturing the pixel data (stripe region image), a dynamic range where the maximum gray level is 60% incidence of the illumination light quantity, for example, is preferably used as the dynamic range of the photodiode array 205.

When acquiring an optical image of the inspection stripe 20, the laser length measuring system 122 measures the position of the XYθ table 102. The measured position information is output to the position circuit 107. The position circuit 107 (calculation unit) calculates the position of the mask substrate 101 by using the measured position information.

Then, the stripe region image of transmitted light is sent to the comparison circuit 108, with data indicating the position of the mask substrate 101 on the XYθ table 102 output from the position circuit 107. Measured data (pixel data) of transmitted light is, for example, 8-bit unsigned data, and indicates a gray-scale level (light intensity) of brightness of each pixel. The stripe region image of the transmitted light output into the comparison circuit 108 is stored in a storage device to be described later.

Similarly, the stripe region image of reflected light is sent to the comparison circuit 108, with data indicating the position of the mask substrate 101 on the XYθ table 102 output from the position circuit 107. Measured data (pixel data) of reflected light is, for example, 8-bit unsigned data, and indicates a gray-scale level (light intensity) of brightness of each pixel. The stripe region image of the reflected light output into the comparison circuit 108 is stored in a storage device to be described later.

The inspection apparatus 100 of the first embodiment performs pattern inspection with respect to the pattern image of the transmitted light. Similarly, pattern inspection is performed with respect to the pattern image of the reflected light.

In the comparison circuit 108, there are arranged a storage device such as a magnetic disk drive (not shown), a dividing circuit, a position adjustment circuit, and a comparison circuit. In the comparison circuit 108, the dividing circuit (not shown) reads a stripe region image of a transmitted light, and divides it by a predetermined size (e.g., the same width as the scan width W) in the x direction. For example, it is divided into frame images each having 512×512 pixels. Thereby, a frame image of a transmitted light of each frame region 30 can be acquired with respect to a plurality of frame regions 30 (FIG. 9) obtained by dividing the inspection stripe 20 by the same width as the scan width W, for example. The frame image of the transmitted light is stored in a storage device (not shown).

In the first embodiment, the "die-to-die inspection" which compares data of optical images of identical patterns captured at different positions on the same mask is performed. For example, the stripe region image described above includes images of two dies where identical patterns are formed. Then, to be corresponding to the frame region 30 of the die (1), a frame image of the frame region 30 of the die (2) (second die) is generated in a similar manner.

The position adjustment circuit (not shown) performs position adjustment, using a predetermined algorithm, between the frame image (third optical image) of a transmitted light of the die (1) to be compared, and the frame image (fourth optical image) of a transmitted light of the die (2) to be compared. For example, the position adjustment is performed using a least-squares method.

The comparison circuit (not shown) compares, for each pixel, the frame image (third optical image) of the transmitted light of the die (1) and the frame image (fourth optical image) of the transmitted light of the die (2) between which position adjustment has been performed. They are compared, for each pixel, according to predetermined determination conditions, using a predetermined determination threshold value, in order to determine whether there is a defect such as a shape defect or not. For example, if a gray scale value difference for each pixel is larger than a determination threshold value Th, it is determined to be a candidate defect. Then, the comparison result is output. The comparison result may be output to the storage device 109, the CRT 117, and the pattern monitor 118, or output from the printer 119.

Alternatively, the "die-to-database inspection" may be performed which compares an optical image with a reference image generated from design data (writing data) being a basis for forming a pattern on the mask substrate 101.

In such a case, the reference image generation circuit 112 generates, for each frame region 30, a reference image based on pattern data defined in design data (writing data) which is a basis for forming a pattern on the mask substrate 101. Specifically, it operates as follows: First, the reference image generation circuit 112 reads the pattern data defined in the design data (writing data) from the storage device 109 through the control computer 110, and converts each figure pattern defined in the read design pattern data into image data of binary or multiple values.

Here, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as a rectangle, a triangle and the like.

When design pattern data, used as figure data, is input to the reference image generation circuit 112, the data is developed into data of each figure. Then, figure codes, figure dimensions and the like indicating figure shapes in the data of each figure are interpreted. Then, the reference image generation circuit 112 develops each figure data to design pattern image data of binary or multiple values as patterns to be arranged in mesh regions in units of grids of predetermined quantization dimensions, and outputs the developed data. In other words, the reference image generation circuit 112 reads design data, calculates an occupancy rate occupied by a figure in the design pattern, for each mesh region obtained by virtually dividing an inspection region into mesh regions in units of predetermined dimensions, and outputs n-bit occupancy rate data. For example, it is preferable that one mesh region is set as one pixel. Assuming that one pixel has a resolution of $\frac{1}{2}^8 (=\frac{1}{256})$, the occupancy rate in each pixel is calculated by allocating small regions which corresponds to the region of the figures arranged in the pixel concerned and each of which is corresponding to a $\frac{1}{256}$ resolution. Then, 8-bit occupancy rate data is output to the reference circuit 112. The mesh region (inspection pixel) may be in accordance with the pixel of measured data.

Next, the reference image generation circuit 112 performs appropriate filter processing on design image data of a design pattern which is image data a figure. Since optical image data as measured data is in the state affected by the filtering by the optical system, in other words, in the analog state continuously changing, it becomes possible to match/fit the design image data with the measured data by also applying the filtering to the design image data being image data on the design side whose image intensity (gray value) is represented by digital values. The generated image data of a reference image is input into the comparison circuit 108 to be stored in a memory (not shown).

The position adjustment circuit (not shown) performs position adjustment, using a predetermined algorithm, between the frame image (third optical image) of a transmitted light to be compared, and the reference image to be compared. For example, the position adjustment is performed using a least-squares method.

The comparison circuit (not shown) compares, for each pixel, the frame image (third optical image) and the reference image to be compared, between which position adjustment has been performed. They are compared, for each pixel, according to predetermined determination conditions, using a predetermined determination threshold value, in order to determine whether there is a defect such as a shape defect or not. For example, if a gray scale value difference of each pixel is larger than a determination threshold value Th, it is determined to be a candidate defect. Then, the comparison result is output. The comparison result may be output to the storage device 109, the CRT 117, and the pattern monitor 118, or output from the printer 119.

Also, with respect to a stripe region image of a reflected light, the same processing as that performed for a stripe region image of a transmitted light is performed. Thereby, a pattern inspection by a transmitted light and a pattern inspection by a reflected light can be performed at the same period. By performing both the transmission inspection and the reflection inspection, a pseudo defect can be eliminated and inspection accuracy can be improved.

As described above, when acquiring a polarized image, the division type half-wave plate 190 and the Rochon prism 192, instead of the beam splitter 191, are arranged in the optical path, and when performing a general pattern inspection, the beam splitter 191, instead of the division type half-wave plate 190 and the Rochon prism 191, is arranged in the optical path. Then, for example, the angle of the polarization plane of the Rochon prism 192 is adjusted so that the objective lens 171, the imaging lens 172, and the mirror 174, which are used in the general inspection mode (2), can be used as they are in the polarized image inspection mode (1) without changing their arrangement position, and the photodiode arrays 105 and 205 in the general inspection mode (2) can be used as they are in the polarized image inspection mode (1) without changing their arrangement position. Thereby, even when capturing images of patterns at different positions on the mask substrate 101 as one for a transmitted image and the other for a reflected image, and forming images at different positions in the general inspection mode (2), it is possible, after separating an image at one position on the mask substrate 101 into a P-polarized wave and an S-polarized wave, to adjust one of the image formation position of the P-polarized wave and the image formation position of the S-polarized wave to one of the image formation position of the transmitted image and the image formation position of the reflected image because the Rochon prism 191 can shift the trajectory. Similarly, it is possible to adjust the other one of the image formation position of the P-polarized wave and the image formation position of the S-polarized wave to the other one of the image formation position of the transmitted image and the image formation position of the reflected image. Thus, not only being able to perform the polarized image inspection mode (1), further, it is possible to perform simultaneous inspections of the transmission inspection and reflection inspection in the general inspection mode (2).

As described above, according to the first embodiment, it is possible to acquire a polarized image which can be used for generating an exposure image to be exposed and transferred in the exposure apparatus. Moreover, the image-forming optical system including the mirror 174 can be used in common between polarized image acquisition and general pattern inspection.

In the above description, each " . . . circuit" includes a processing circuitry. As the processing circuitry, for example, an electric circuit, computer, processor, circuit board, quantum circuit, semiconductor device, or the like can be used. Each " . . . circuit" may use a common processing circuitry (same processing circuitry), or different processing circuitries (separate processing circuitries). A program for causing a processor to execute processing may be stored in a recording medium, such as a magnetic disk drive, magnetic tape drive, FD, ROM (Read Only Memory), etc. For example, the position circuit 107, the comparison circuit 108, and the reference image generation circuit 112 may be configured by at least one circuit described above. Similarly, the dividing circuits 54 and 56, the correction circuit 62, the combining circuit 64, the position adjustment circuit 70, and the comparison circuit 72 can be configured by the processing circuits described above.

Embodiments have been explained referring to specific examples described above. However, the present invention is not limited to these specific examples. In the above examples, after correcting the gray scale value of the frame image of the P-polarized wave to be adjusted to the exposure image, combining is performed between the frame image (first optical image) of the P-polarized wave having been corrected, and the frame image (second optical image) of the S-polarized wave not having been corrected, but, it is not limited thereto. Since the die-to-die inspection is being performed, as long as images are combined by using the same condition, it is not necessarily required to be adjusted to an exposure image. Therefore, combining may be performed based on a ratio different from an exposure image. Moreover, it is also preferable to use the first optical image and the second optical image independently for inspection without combining them. Moreover, although, in the examples described above, the distance between adjacent patterns is inspected, it is not limited thereto. For example, a gray scale value of a composite frame image (first die image) and a gray scale value of a composite frame image (second die image) may be compared for each pixel by using a predetermined algorithm. For example, if a difference obtained by subtracting the gray scale value of the composite frame image (second die image) from the gray scale value of the composite frame image (first die image) is larger than a threshold value, it is determined that there is a defect.

While the apparatus configuration, control method, and the like not directly necessary for explaining the present invention are not described, some or all of them can be selectively and appropriately used on a case-by-case basis when needed.

Moreover, any other polarized image acquisition apparatus, pattern inspection apparatus, and polarized image acquisition method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A polarized image acquisition apparatus comprising:
   a stage configured to mount thereon a mask substrate for exposure on which a pattern is formed, and to be movable;
   an objective lens configured to receive a transmitted light having passed through the mask substrate;
   a division type half-wave plate arranged opposite to the mask substrate with respect to the objective lens, and close to a pupil position of the objective lens, and configured to arrange a P-polarized wave and an S-polarized wave of the transmitted light having passed through the objective lens to be in mutually orthogonal directions;
   a Rochon prism configured to separate a trajectory of the P-polarized wave from a trajectory of the S-polarized wave of the transmitted light having passed through the mask substrate and the objective lens;
   an imaging lens configured to focus to form images of the P-polarized wave and the S-polarized wave having passed through the Rochon prism at image formation positions different from each other;
   a mirror configured, in a case where one of the P-polarized wave and the S-polarized wave is focused and formed at one of the different image formation positions, to reflect an other one of the P-polarized wave and the S-polarized wave at an other one of the different image formation positions;
   a first image sensor configured to capture an image of the one of the P-polarized wave and the S-polarized wave; and
   a second image sensor configured to capture an image of the other one of the P-polarized wave and the S-polarized wave.

2. The apparatus according to claim 1, further comprising:
   a combining circuit configured to combine a first optical image made by the one of the P-polarized wave and the S-polarized wave, and a second optical image made by the other one of the P-polarized wave and the S-polarized wave; and
   a comparison circuit configured to compare a first die image in which the first optical image and the second optical image in a first die are combined, and a second die image in which are combined the first optical image and the second optical image in a second die where a same pattern as that in the first die is formed, wherein the second die image corresponds to the first die image.

3. The apparatus according to claim 1, wherein the P-polarized wave and the S-polarized wave enter the Rochon prism through a same trajectory.

4. The apparatus according to claim 3, wherein the P-polarized wave and the S-polarized wave having passed through the Rochon prism enter the imaging lens and are focused and formed at different positions by the imaging lens.

5. A polarized image acquisition method comprising:
   illuminating a mask substrate for exposure, on which a pattern is formed, with an illumination light;
   receiving a transmitted light, being the illumination light having passed through the mask substrate, by an objective lens;
   arranging a P-polarized wave and an S-polarized wave of the transmitted light having passed through the objective lens to be in mutually orthogonal directions, by using a division type half-wave plate arranged opposite to the mask substrate with respect to the objective lens, and close to a pupil position of the objective lens;
   separating a trajectory of the P-polarized wave from a trajectory of the S-polarized wave of the transmitted light having passed through the mask substrate and the objective lens by using a Rochon prism;
   focusing and forming images of the P-polarized wave and the S-polarized wave having passed through the Rochon prism at image formation positions different from each other by using an imaging lens;
   reflecting, in a case where one of the P-polarized wave and the S-polarized wave is focused and formed at one of the different image formation positions, an other one of the P-polarized wave and the S-polarized wave at an other one of the different image formation positions by using a mirror;
   capturing an image of the one of the P-polarized wave and the S-polarized wave by using a first image sensor; and
   capturing an image of the other one of the P-polarized wave and the S-polarized wave by using a second image sensor.

* * * * *